(12) United States Patent
Ippoushi et al.

(10) Patent No.: US 7,907,408 B2
(45) Date of Patent: Mar. 15, 2011

(54) COOLING APPARATUS AND POWER CONVERTER

(75) Inventors: Shigetoshi Ippoushi, Tokyo (JP); Tetsuya Takahashi, Tokyo (JP); Kazuyoshi Toya, Tokyo (JP); Fumiharu Yabunaka, Tokyo (JP); Kunihiko Kaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 265 days.

(21) Appl. No.: 12/293,282

(22) PCT Filed: Apr. 12, 2007

(86) PCT No.: PCT/JP2007/058063
§ 371 (c)(1),
(2), (4) Date: Sep. 17, 2008

(87) PCT Pub. No.: WO2007/119783
PCT Pub. Date: Oct. 25, 2007

(65) Prior Publication Data
US 2010/0232110 A1 Sep. 16, 2010

(30) Foreign Application Priority Data
Apr. 13, 2006 (JP) ................ 2006-111238

(51) Int. Cl.
*H05K 7/20* (2006.01)
*F28D 15/00* (2006.01)

(52) U.S. Cl. ........ 361/700; 361/694; 361/699; 361/701; 361/704; 361/717; 165/80.5; 165/104.21; 165/104.24; 165/104.33; 165/185; 363/141

(58) Field of Classification Search ............. 361/679.47, 361/679.52–679.54, 694–701, 703–704, 361/717; 165/80.4–80.5, 104.21, 104.24, 165/104.29, 104.33, 185; 363/141
See application file for complete search history.

(56) References Cited

U.S. PATENT DOCUMENTS

| 4,552,208 A | * | 11/1985 | Sorensen | 165/104.22 |
|---|---|---|---|---|
| 6,561,262 B1 | | 5/2003 | Osakabe et al. | |
| 7,201,215 B2 | * | 4/2007 | Ippoushi et al. | 165/104.24 |
| 7,721,793 B2 | * | 5/2010 | Ippoushi et al. | 165/104.24 |
| 7,810,551 B2 | * | 10/2010 | Ippoushi et al. | 165/104.28 |
| 2004/0194929 A1 | | 10/2004 | Ippoushi et al. | |
| 2005/0155744 A1 | | 7/2005 | Ippoushi et al. | |
| 2009/0065182 A1 | * | 3/2009 | Takahashi et al. | 165/104.33 |
| 2009/0080155 A1 | * | 3/2009 | Takahashi et al. | 361/695 |

FOREIGN PATENT DOCUMENTS

| GB | 2225099 A | * | 5/1990 |
|---|---|---|---|
| JP | 60 2890 | | 1/1985 |
| JP | 8 204075 | | 8/1996 |
| JP | 2001 148452 | | 5/2001 |
| JP | 2004 245566 | | 9/2004 |
| JP | 2005 195226 | | 7/2005 |

* cited by examiner

*Primary Examiner* — Robert J Hoffberg
(74) *Attorney, Agent, or Firm* — Oblon, Spivak, McClelland, Maier & Neustadt, L.L.P.

(57) ABSTRACT

A cooling apparatus with high strength and good heat radiation characteristics. In the cooling apparatus, a heat exchanger is joined to an evaporator disposed on the lower side in a face to face manner; a containing unit of the heat exchanger includes a heat exchanger high temperature liquid outlet, and a two-phase fluid inlet in a joint portion with the evaporator; an outlet header of the heat exchanger includes an intermediate liquid outlet at a joint portion with the evaporator; and the evaporator includes a two-phase fluid outlet in the joint portion with the heat exchanger in opposition to the two-phase fluid inlet of the containing unit, and including an intermediate liquid inlet at the joint portion with the heat exchanger in opposition to the intermediate liquid outlet of the outlet header.

7 Claims, 16 Drawing Sheets

COOLING APPARATUS AND POWER CONVERTER

TECHNICAL FIELD

The present invention relates to heat transporting apparatuses, and relates to a cooling apparatus which cools heat of a heating element and a power converter which uses the cooling apparatus.

BACKGROUND ART

In important facilities related to lifeline such as energy supply equipment, information and telecommunication equipment, and traffic facilities, many electronic apparatuses have been used in recent years. These electronic apparatuses need to be stably and surely operated, and heat generated by an electronic apparatus is required to be radiated. As heat radiation means, there are a wide variety of modes; and there is a cooling apparatus (for example, see Patent Document 1.) as one of the heat radiation means having high reliability suited to high efficiency, energy saving, and environmental conservation. The cooling apparatus is configured such that a heat exchange circulating solution is circulated in the apparatus by using a density difference (buoyancy caused by density difference) in a circulating solution transport pipe, caused by phase change of the heat exchange circulating solution. That is, the heat exchange circulating solution is made to circulate by using the density difference between an apparent density of a gas-liquid two-phase fluid in a gas-liquid two-phase fluid inlet pipe between a heating heat exchanger and a two-phase fluid inlet and a density of the heat exchange circulating solution in the circulating solution transport pipe in the same longitudinal length as that between the heating heat exchanger and the two-phase fluid inlet. Furthermore, by repeating this circulation, high-temperature heat transferred from the heating heat exchanger is transported to a sensible-heat-emitting heat exchanger and a heat radiator, and the heat is transported to other apparatus or a low heat source which requires the heat from the sensible-heat-emitting heat exchanger and the heat radiator.

[Patent Document 1] Japanese Unexamined Patent Publication No. 2005-195226 (pp. 4 to 6, FIG. 1)

DISCLOSURE OF THE INVENTION

Problems to be Solved by the Invention

The aforementioned known cooling apparatus has the heating heat exchanger in which the gas-liquid two-phase fluid inlet pipe for feeding and delivering the heat exchange circulating solution is configured by piping; and therefore, there is a problem in that strength is low. Furthermore, in the aforementioned cooling apparatus, there is a problem in that when noncondensing gas such as air enters into the inside through a minute crack, condensation characteristics of the heat exchange circulating solution at around the pipe in a heat exchange circulating solution container deteriorate; and consequently, desired heat radiation characteristics (heat transportation characteristics) cannot be obtained.

This invention has been made to solve the foregoing problems, and an object of the present invention is to provide a cooling apparatus with high strength and good heat radiation characteristics.

Means for Solving Problem

According to the present invention, there is provided a cooling apparatus including: a block shaped evaporator in which an evaporator flow path through which a circulating liquid flows is formed in the inside, also a heating element is arranged on the outside, and the circulating liquid is heated by heat emitted from the heating element; a heat radiator which has a heat radiator flow path through which the circulating liquid flows, and emits heat of the circulating liquid; and a heat exchanger which includes an inlet header having a heat exchanger low temperature liquid inlet to which the circulating liquid is fed from the heat radiator, an outlet header having an intermediate liquid outlet from which the circulating liquid is delivered to the evaporator, and a containing unit which contains heat exchanger flow paths for linking the inlet header and the outlet header, the circulating liquid heated by the evaporator, and vapor of the circulating liquid. The heat exchanger is joined to the evaporator disposed on the lower side of the heat exchanger in a face to face manner; the containing unit has a heat exchanger high temperature liquid outlet from which the circulating liquid is delivered to the heat radiator, and has a two-phase fluid inlet to which the circulating liquid and the vapor of the circulating liquid are fed from the evaporator in a joint portion with the evaporator; the outlet header has the intermediate liquid outlet at a joint portion with the evaporator; and the evaporator has a two-phase fluid outlet from which the circulating liquid and the vapor of the circulating liquid are delivered to the containing unit in the joint portion with the heat exchanger in opposition to the two-phase fluid inlet, and has an intermediate liquid inlet to which the circulating liquid is fed from the outlet header at the joint portion with the heat exchanger in opposition to the intermediate liquid outlet.

Furthermore, according to the present invention, there is provided a cooling apparatus including: a block shaped evaporator in which an evaporator flow path through which a circulating liquid flows is formed in the inside, also a heating element is arranged on the outside, and the circulating liquid is heated by heat emitted from the heating element; a heat radiator which has a heat radiator flow path through which the circulating liquid flows, and emits heat of the circulating liquid; and a heat exchanger which includes an inlet header having a heat exchanger low temperature liquid inlet to which the circulating liquid is fed from the heat radiator, an outlet header having an intermediate liquid outlet from which the circulating liquid is delivered to the evaporator, and a containing unit which contains heat exchanger flow paths for linking the inlet header and the outlet header, the circulating liquid heated by the evaporator, and vapor of the circulating liquid. The heat exchanger is joined to the evaporator disposed on the lower side in a face to face manner; the containing unit has an opening portion in a joint portion with the evaporator; and the outlet header has the intermediate liquid outlet at a joint portion with the evaporator. The evaporator has a circulating liquid holding unit, which holds the circulating liquid, depressed from a joint face with the heat exchanger in opposition to the opening portion; has a two-phase fluid outlet from which the circulating liquid and the vapor of the circulating liquid are delivered to the containing unit in an undersurface of the circulating liquid holding unit and an evaporator high temperature liquid inlet to which the circulating liquid is fed from the containing unit; has an intermediate liquid inlet to which the circulating liquid is fed from the outlet header at the joint portion with the heat exchanger in opposition to the intermediate liquid outlet; has an evaporator high temperature liquid outlet from which the circulating liquid is delivered to the heat radiator; and is formed with a high temperature liquid flow path which communicates the evaporator high temperature liquid inlet and the evaporator high temperature liquid outlet in the inside.

Advantageous Effect of the Invention

According to the present invention, a cooling apparatus with high strength and good heat radiation characteristics can be provided.

DESCRIPTION OF REFERENCE NUMERALS

1 Heat exchanger, 2 Inlet header, 3 Containing unit, 4 Outlet header, 5 Heat exchanger low temperature liquid inlet, 6 Two-phase fluid inlet, 7 Heat exchanger high temperature liquid outlet, 8 Intermediate liquid outlet, 9 Heat exchanger flow path, 11a Vapor, 11b High temperature circulating liquid, 11c condensate liquid, 12 Opening portion, 13 Sealing port, 14 Evaporator, 15 Evaporator flow path, 15a Heated flow path, 15b Non-heated flow path, 15c Diverging header, 16 Heating element, 16a Strong heating element, 16b Weak heating element, 18 Heat radiator, 19 Heat radiator flow path, 19a Diverging header, 19b Converging header, 19c Parallel flow paths, 20 Fin, 21 Heat exchanger heat radiation unit, 22 Auxiliary heat radiator, 23 Recess, 24 Fin, 25 Heat exchanger cooling flow path, 26 Fan, 27 Circulating liquid holding unit, 28 Bypass flow path, 29 High temperature portion, 30 Low temperature portion, 31 Partition plate, 32 Case, 33 Heat radiator cooling flow path, 34 Opening, 35 Mounting portion, 36 Obstruction plate, 37 Thermal insulation portion, 38 Flow blocking body, 41 Intermediate liquid inlet, 42 Two-phase fluid outlet, 43 Evaporator high temperature liquid inlet, 44 Evaporator high temperature liquid outlet, 45 Evaporator low temperature liquid inlet, 46 Evaporator low temperature liquid outlet, 47 High temperature liquid flow path, and 48 Low temperature liquid flow path.

BEST MODE FOR CARRYING OUT THE INVENTION

Embodiment 1

Figure 1:
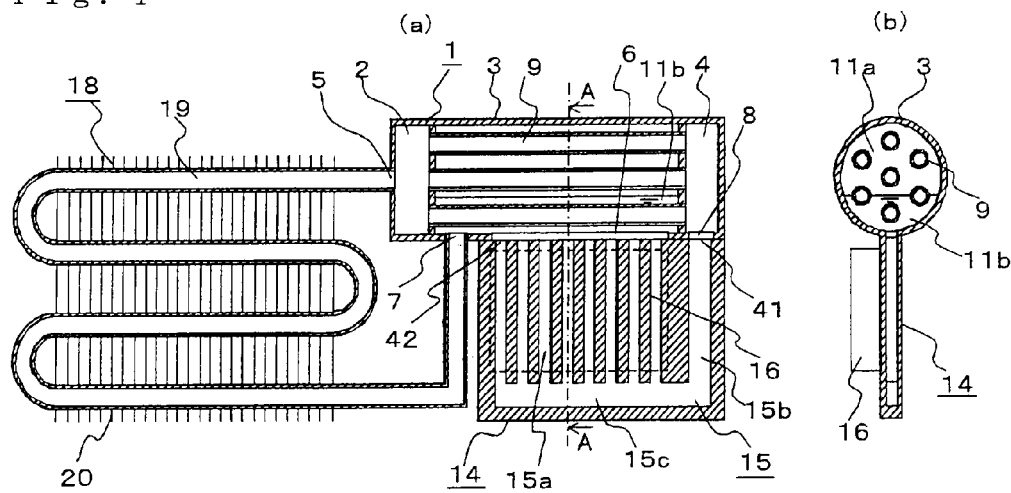
FIG. 1 is a cross-sectional view showing a configuration of a cooling apparatus according to Embodiment 1 of the present invention.

FIG. 1 is a cross-sectional view showing a configuration of a cooling apparatus according to Embodiment 1 of the present invention; and FIG. 1(*b*) is a cross-sectional view in the cross section A-A shown in FIG. 1(*a*). In the drawings, those which are given the same reference numerals are identical or equivalent to those; and this is available to the whole text of this specification.

In FIG. 1, the cooling apparatus includes a block shaped evaporator 14 which makes a circulating liquid change phase to the circulating liquid and vapor of the circulating liquid by using heat from a heating element 16, a heat exchanger 1 which makes the vapor of the circulating liquid condense, and a heat radiator 18 which emits heat of the circulating liquid; and an undersurface of the heat exchanger 1 and an upper surface of the evaporator 14 are joined in a face to face manner by using brazing, welding, or the like. The heat exchanger 1 is a cylindrical container in which an inlet header 2, a containing unit 3, and an outlet header 4 are linked; and the inlet header 2 and the outlet header 4 are linked by using a plurality of pipe-shaped heat exchanger flow paths 9. The inlet header 2 has a heat exchanger low temperature liquid inlet 5, to which the circulating liquid is fed from the heat radiator 18, at a side surface thereof; and an outlet header 4 has an intermediate liquid outlet 8, from which the circulating liquid is delivered to the evaporator 14, at a joint portion with the evaporator at the undersurface. The containing unit 3 has a heat exchanger high temperature liquid outlet 7, from which the circulating liquid is delivered to the heat radiator 18, at the undersurface; and has a two-phase fluid inlet 6, to which the circulating liquid and the vapor of the circulating liquid are fed from the evaporator 14, in a joint portion with the evaporator in the undersurface. In this case, the joint portion between the heat exchanger 1 and the evaporator 14 means a joint face between the heat exchanger 1 and the evaporator 14 and indicates a portion where the heat exchanger 1 and the evaporator 14 are joined. In addition, in the present Embodiment 1, the heat exchanger 1, the evaporator 14, and the heat radiator 18 are made up of copper; and a metal with good heat conduction is preferable.

A heat radiator flow path 19 of the heat radiator 18 is connected to the heat exchanger low temperature liquid inlet 5 of the inlet header 2. The inlet header contains a low temperature circulating liquid which is fed from the heat exchanger low temperature liquid inlet 5, and has a function which delivers the low temperature circulating liquid to the heat exchanger flow paths 9. In addition, when the low temperature circulating liquid to be fed from the heat exchanger low temperature liquid inlet 5 is delivered to the plurality of the heat exchanger flow paths 9, in order to uniformize the flow rate of the low temperature circulating liquid flowing in the respective heat exchanger flow paths 9, there may be provided a flow adjustment structural body (for example, a guide blade or a flow adjusting grid), which leads the low temperature circulating liquid to the respective heat exchanger flow paths 9, in the inlet header 2. Furthermore, in order to further reduce temperature of the low temperature circulating liquid contained in the inlet header 2, a protrusion such as a fin which is heat exchangeable with the environmental space may be provided on an inner wall surface of the inlet header 2.

The containing unit 3 has a function which contains the plurality of the pipe-shaped heat exchanger flow paths 9, a high temperature circulating liquid 11b which is fed from the evaporator 14 through the two-phase fluid inlet 6, and vapor 11a in which a part of the circulating liquid is gasified. Furthermore, the containing unit 3 has the heat exchanger high temperature liquid outlet 7 to which the heat radiator flow path 19 of the heat radiator 18 is connected, and has a function which delivers the high temperature circulating liquid 11b to the heat radiator 18 through the heat exchanger high temperature liquid outlet 7.

The heat exchanger flow paths 9 have a function which performs heat exchange through walls of the heat exchanger flow paths 9 by a temperature difference between the low temperature circulating liquid fed from the inlet header 2 and the high temperature circulating liquid 11b and its vapor 11a contained in the containing unit 3, and delivers a circulating liquid (intermediate liquid) whose temperature is raised by the heat exchange to the outlet header. Furthermore, with the heat exchange, the heat exchanger flow paths 9 have a function which condenses the vapor 11a contained in the containing unit 3, and prevents an internal pressure of the cooling apparatus from being excessively increased. In the case where a multicomponent fluid such as an ethylene glycol aqueous solution is used as the circulating liquid, the high temperature circulating liquid 11b contained in the containing unit 3 and a circulating liquid in which the vapor 11a is condensed and produced by an outer wall of the heat exchanger flow paths 9 are stirred and mixed in the containing unit 3. In addition, in order to promote condensation of the vapor 11a contained in the containing unit 3, a protrusion such as a fin may be provided on an inner wall surface of the containing unit 3.

The outlet header 4 has a function which contains the circulating liquid fed from the heat exchanger flow paths 9, and delivers the circulating liquid which is temperature-raised by the heat exchanger flow paths 9 to the evaporator 14 through the intermediate liquid outlet 8. Furthermore, a protrusion such as a flow adjustment structural body or a fin may be provided at the inside of the outlet header 4 as in the inlet header 2.

The heat exchanger 1 is the container having the inlet header 2, the containing unit 3, and the outlet header 4; and the heat exchanger 1 has a function which raises temperature of the low temperature circulating liquid fed from the heat exchanger low temperature liquid inlet 5 by the heat exchange with the high temperature circulating liquid 11b and the vapor 11a in the containing unit 3 during flowing in the heat exchanger flow paths 9, and delivers from the intermediate liquid outlet 8 to the evaporator 14. Furthermore, the heat exchanger 1 has the function which condenses the vapor 11a fed from the two-phase fluid inlet 6 to become the high temperature circulating liquid 11b, and delivers from the heat exchanger high temperature liquid outlet 7 together with the high temperature circulating liquid 11b fed from the two-phase fluid inlet 6. In addition, a mounting position of the heat exchanger low temperature liquid inlet 5 is not particularly limited as long as the position is located at the wall surface of the inlet header 2. Furthermore, a mounting position of the heat exchanger high temperature liquid outlet 7 may be a position as long as the position is located at the wall surface of the containing unit 3 and in contact with the high temperature circulating liquid 11b contained in the containing unit 3.

The rectangular solid block shaped evaporator 14 is joined to the heat exchanger 1 on the upper surface; and the rectangular solid block shaped evaporator 14 has an intermediate liquid inlet 41, to which the circulating liquid is fed from the outlet header 4 of the heat exchanger 1, at the joint portion with the heat exchanger 1 in opposition to the intermediate liquid outlet 8 of the heat exchanger 1; and has a two-phase fluid outlet 42, from which the high temperature circulating liquid 11b and the vapor of the circulating liquid are delivered to the containing unit 3 of the heat exchanger 1, in the joint portion with the heat exchanger 1 in opposition to the two-phase fluid inlet 6 of the heat exchanger 1. Furthermore, an evaporator flow path 15 which communicates the intermediate liquid inlet 41 and the two-phase fluid outlet 42 is formed in the inside of the evaporator 14; and the heating element 16 is arranged on the outside of the evaporator 14 so as to transfer the heat to the evaporator 14.

The evaporator flow path 15 has a plurality of parallel heated flow paths 15a which are adjacent to the heating element 16, a non-heated flow path 15b which is not adjacent to the heating element 16, and a diverging header 15c which diverges the circulating liquid to the plurality of the heated flow paths 15a from the non-heated flow path 15b. The circulating liquid fed from the outlet header 4 of the heat exchanger 1 through the intermediate liquid inlet 41 flows in the non-heated flow path 15b. Then, the circulating liquid is diverged in the diverging header 15c and flows in the plurality of the heated flow paths 15a, and is delivered to the containing unit 3 of the heat exchanger 1 through the two-phase fluid outlet 42. In addition, although not shown in FIG. 1, the evaporator flow path 15 may have a converging header on which the circulating liquid is converged from the plurality of the heated flow paths 15a to the gas-liquid two-phase fluid outlet 42.

The evaporator 14 has a function which raises temperature of the circulating liquid flowing in the non-heated flow paths 15a by the heat applied from the heating element 16 to the evaporator 14, and produces a gas-liquid two-phase fluid composed of the high temperature circulating liquid 11b and vapor by making at least a part of the circulating liquid perform a phase change to vapor. In addition, in the case where the multicomponent fluid is used as the circulating liquid, there is also provided a function which condenses the circulating liquid. Further, there is also provided a function which raises the gas-liquid two-phase fluid by buoyancy caused by a difference between an apparent density of the gas-liquid two-phase fluid and a density of the circulating liquid. Therefore, the heated flow paths 15a are configured so that the gas-liquid two-phase fluid flows upward.

The heated flow paths 15a are the plurality of parallel flow paths; and therefore, a number of the heating elements 16 or the heating element 16 having a large area can be installed on the evaporator 14, and a heat transfer area with respect to the heating element 16 can be increased, and heat radiation characteristics of the cooling apparatus can be improved. Furthermore, in FIG. 1, the non-heated flow path 15b is shown as a single flow path; however, the heated flow paths 15a and the non-heated flow path 15b may be a plurality of parallel flow paths. The heated flow paths 15a and the non-heated flow paths 15b are the plurality of parallel flow paths; and accordingly, the evaporator 14 can be manufactured as a laminated configuration, and the evaporator 14 can be reduced in size and in weight.

The evaporator 14 may be formed by die forming or by cutting processing. When the cutting processing is performed, manufacturing may be made by forming the diverging header 15c from either face of the diverging header 15c and by blocking an opening produced during the processing. Furthermore, manufacturing may be made by soldering or by brazing a flat plate and another member formed with a recess for the flow path portion.

Furthermore, a flow path cross-sectional shape of the evaporator flow path 15 may be a circular shape, a semicircular shape, an elliptical shape, a rectangular shape, or a combination thereof; and a protrusion such as a fin may be formed on its inner wall surface. In addition, in the case where the evaporator flow path 15 has a rectangular section, the circulating liquid tends to stagnate at a corner portion of the flow path section, and it becomes difficult to raise the circulating liquid by the vapor; and therefore, the flow rate of the circulating liquid which circulates in the cooling apparatus lowers, and heat transportation characteristics are deteriorated. Therefore, it is preferable that the cross-sectional shape of the evaporator flow path 15 is the circular shape or the elliptical shape.

The heating element 16 may be any one as long as its heat can be applied to the evaporator 14; and its size, shape, configuration, and the like are not particularly limited; for example, the heating element 16 is an electronic apparatus, a heating heater, a heat radiation unit of a heat transporting apparatus and/or a freezing cycle.

The heat radiator 18 has a pipe-shaped heat radiator flow path 19 which links the heat exchanger high temperature liquid outlet 7 of the containing unit 3 and the heat exchanger low temperature liquid inlet 5 of the inlet header 2, and a plurality of fins 20 arranged so as to transfer the heat to at least a part of outer wall of the heat radiator flow path 19. The heat radiator 18 has a function which emits the heat to the environment (air, fluid such as water, soil, and solid such as equipment requiring heat) through the wall of the heat radiator flow path 19 and the fins 20, the heat being retained in the high temperature circulating liquid which is fed from the containing unit 3 and flows in the heat radiator flow path 19; and the heat radiator 18 also has a function which feeds cooled low temperature circulating liquid from the heat exchanger low temperature liquid inlet 5 to the inlet header 2.

In addition, the heat radiator 18 may be installed uncovered directly in any space (for example, in the air, in the water, and in the soil) and may radiate heat by means of heat conduction, natural- and forced-convection heat transfer, radiation, and the like. Furthermore, the heat radiator 18 may use natural wind; and in the case where the cooling apparatus is mounted on a mobile body such as vehicles, the cooling apparatus may radiate heat by using blowing wind. Further, heat radiation may be made by making a cooling fluid flow around the heat radiator 18 by means of a fan or a pump; or the heat radiation may be made by using discharged wind or discharged water from other equipment provided around the cooling apparatus. The heat radiator 18 may be any one as long as the heat of the circulating liquid is emitted to the outside: and its shape, size, configuration, and the like are not particularly limited.

Furthermore, the heat radiator flow path 19 is shown as a meander-shaped single pipe in FIG. 1; however, a plurality of flow paths may be provided in parallel; and there may be provided a diverging header which diverges to the plurality of the parallel flow paths, or a converging header on which the plurality of the parallel flow paths are converged. Further, in order to uniformize the flow rate (improve diverging characteristics) of the circulating liquid flowing in the respective flow paths, there may be provided a flow adjustment structural body which leads the circulating liquid into the diverging header or the converging header. The heat radiator flow path 19 may be a circular pipe, an elliptical pipe, a rectangular pipe, a flat pipe, a corrugated pipe (flexible pipe), or a combination thereof. Furthermore, a protrusion such as a fin or a turbulence promotion body may be provided on an inner wall surface of the heat radiator flow path 19.

Next, the operation of the cooling apparatus according to the present Embodiment 1 will be described. A circulating liquid flows in order in a circulation flow path which links the inlet header 2 of the heat exchanger 1, the heat exchanger flow paths 9, the outlet header 4, the evaporator flow path 15 of the evaporator 14, the containing unit 3 of the heat exchanger 1, and the heat radiator flow path 19 of the heat radiator 18; and circulates in the cooling apparatus. A high temperature circulating liquid 11b contained in the containing unit 3 emits sensible heat around the radiator 18 and becomes a low temperature circulating liquid when the circulating liquid 11b passes through the heat radiator flow path 19 of the radiator 18. The low temperature circulating liquid is fed from the heat exchanger low temperature liquid inlet 5 to the inlet header 2, diverged in the inside of the inlet header 2, and fed to the plurality of the heat exchanger flow paths 9. When the low temperature circulating liquid passes through the heat exchanger flow paths 9, the low temperature circulating liquid is temperature-raised and preheated by heat exchanging with the high temperature circulating liquid 11b and vapor 11a contained in the containing unit 3. The temperature-raised circulating liquid is converged in the outlet header 4, delivered to the evaporator flow path 15 through the intermediate liquid outlet 8 and the intermediate liquid inlet 41, further temperature-raised up to a high temperature and boiled by the heating element 16 adjacent to the evaporator flow path 15, and returned to the containing unit 3 through the two-phase fluid outlet 42 and the two-phase fluid inlet 6 while changing phase to vapor. The high temperature circulating liquid 11b and the vapor 11a returned to the containing unit 3 are heat exchanged with the circulating liquid in the heat exchanger flow paths 9. A part of the vapor 11a becomes a condensate liquid by being condensed, and the condensate liquid is flown down. Furthermore, the high temperature circulating liquid 11b and the condensate liquid returned to the containing unit 3 are mixed and flown again in the circulation flow path; and heat radiation, preheating, temperature raising to the boiling temperature, and condensation are repeated while being circulated in the cooling apparatus.

The cooling apparatus of this invention is configured such that the circulating liquid is circulated in the cooling apparatus by using a density difference (buoyancy caused by the density difference) in the circulation flow path, caused by the phase change of the circulating liquid. That is, the circulating liquid is made to circulate by using a difference (density difference) between an apparent density of a gas-liquid two-phase fluid in the evaporator flow path 15 between the lower end of the heating element 16 and the two-phase fluid inlet 6 and a density of the circulating liquid in the circulation flow path in the same longitudinal length as that between the lower end of the heating element 16 and the two-phase fluid inlet 6. Furthermore, by repeating this circulation, the heat transferred from the heating element 16 is transported to the heat radiator 18; and consequently, the heat is emitted to the environment from the heat radiator 18.

Therefore, in the cooling apparatus of this invention, with regard to a positional relationship among the heat exchanger 1, the heat radiator 18, and the evaporator 14, the evaporator 14 is merely required to be situated below the heat exchanger 1; and any relationship other than between the evaporator 14 and the heat exchanger 1 may be different from that of the cooling apparatus shown in FIG. 1. For example, the heat radiator 18 may be situated above the evaporator 14 and the heat exchanger 1.

In addition, the heat exchanger 1, the heat radiator 18, and the evaporator 14 may be made up of a good heat conduction metal such as copper.

The circulating liquid may preferably be such fluids as have good heat characteristics (for example, having high heat conductivity or large specific heat), good hydrodynamic characteristics (for example, having small coefficient of viscosity), and large density ratio of liquid to that of gas. Then, there may be used liquids which are single-component liquids such as distilled water, alcohol, or a liquid metal; water solutions such as an antifreeze solution or an alcohol aqueous solution; and mixed liquids such as a magnetic fluid, all of which exhibit phase change between gas and liquid. The vapor 11a is one in which the circulating liquid or a part thereof is gasified; however, there may be slightly mixed with noncondensing gas such as air.

As described above, the cooling apparatus of the present Embodiment 1 is configured such that the heat transferred from the heating element 16 is transported to the heat radiator 18 and the heat is emitted to the environment from the heat radiator 18 by using the density difference in the circulation flow path caused by the phase change of the circulating liquid while circulating the circulating liquid in the cooling apparatus. Therefore, a large amount of heat can be transported in every direction (horizontal direction, from the lower side to the upper side, from the upper side to the lower side, and the like) without using an external power supply for circulating the circulating liquid. Furthermore, a pump or the like having a movable section is not required; and therefore, a small and lightweight cooling apparatus with high durability and reliability can be provided.

Furthermore, in the cooling apparatus according to the present Embodiment 1, the two-phase fluid inlet 6 and the intermediate liquid outlet 8 of the heat exchanger 1 joined to the block shaped evaporator 14 in a face to face manner are arranged in/at the joint portions with the evaporator 14; the two-phase fluid outlet 42 of the evaporator 14 is arranged in the joint portion with the heat exchanger 1 in opposition to the two-phase fluid inlet 6; and the intermediate liquid inlet 41 of the evaporator 14 is arranged at the joint portion with the heat exchanger 1 in opposition to the intermediate liquid outlet 8. Therefore, there is no pipe portion protruding to the outside between the heat exchanger 1 and the evaporator 14, and an area of the joint portion of the heat exchanger 1 and the evaporator 14 is large; and therefore, sealing property can be enhanced, strength and quake resistance can be improved, and reliability can be improved.

Furthermore, in the known cooling apparatus, at least a part of the evaporator flow path 15 is manufactured by bending a pipe or by linking a plurality of members; and therefore, it is difficult to mount by correctly positioning (to correctly defining each length and each bending angle) the both ends of the evaporator flow path 15 to the two-phase fluid inlet 6 and the intermediate liquid outlet 8 of the heat exchanger 1. However, in the cooling apparatus according to the present Embodiment 1, the block shaped evaporator 14 is joined to the heat exchanger 1 in a face to face manner, and the two-phase fluid inlet 6 and the intermediate liquid outlet 8 of the heat exchanger 1 and the two-phase fluid outlet 42 and the intermediate liquid inlet of the evaporator 14 are arranged in face-to face relation with each other; and therefore, the respective mounting positions can be correctly defined and formed, and it becomes possible to manufacture very easily. Further, in order to increase a thermal contact area and to improve heat radiation characteristics, even in the case where the evaporator flow path 15 is configured as the plurality of the parallel flow paths, the joint portion is not increased and it is possible to manufacture easily. Furthermore, the heated flow paths 15a and the non-heated flow path 15b of the evaporator flow path 15 can be adjacently arranged; and therefore, the cooling apparatus can be reduced in size.

In addition, the heat exchanger 1 is not required to be the cylindrical container as shown in FIG. 1; however, the heat exchanger 1 may be made in a cube or a rectangular solid. Furthermore, a central axis of the shape of the heat exchanger 1 is deviated from a central axis of the shape of the evaporator 14 in the cross-section shown in FIG. 1(b), and an offset arrangement may be made. By making the offset arrangement, a large space can be made in the lower side of the heat exchanger 1 and on the side surface side of the evaporator 14, the heating element 16 can be effectively contained in this space, and the cooling apparatus can be reduced in size. Furthermore, in the case where the containing unit 3 is a cylindrical container, and when the offset arrangement is made, the gas-liquid two-phase fluid fed from the two-phase fluid inlet 6 moves along the inner wall surface of the cylindrical containing unit 3, large centrifugal force is exerted on the high temperature circulating liquid 11b by the vapor; and therefore, the high temperature circulating liquid 11b moves along the inner wall surface of the containing unit 3, and the vapor moves to the center of the containing unit 3. This promotes to separate the high temperature circulating liquid 11b from the vapor 11a; and therefore, the vapor 11a becomes easier to come in contact with the outer wall of the heat exchanger flow paths 9, and heat exchange characteristics in the heat exchanger flow paths 9 are improved. Further, the gas-liquid two-phase fluid with high speed fed from the two-phase fluid inlet 6 becomes difficult to impinge against the heat exchanger flow paths 9; and therefore, resistance to corrosion of the heat exchanger flow paths 9 is improved and strength and quake resistance are improved. Therefore, the heat exchanger flow paths 9 with smaller diameter can be used, an area of the heat exchanger flow paths 9 is enlarged and the heat exchange characteristics can be improved, and the wall of the heat exchanger flow paths 9 can be thinned and reduced in weight.

The heat exchanger flow paths 9 may be a plurality of pipings as shown in FIG. 1, it may be a configuration in which a plurality of flow paths are gathered or it may be configured such that a part of the heat exchanger flow paths 9 and the wall of the containing unit 3 are integrated. Furthermore, in FIG. 1, the heat exchanger flow path 9 is shown as a linear flow path; however, a flow path formed in a U-shape, a meander shape, a spiral shape, or the like may be used. Further, it is preferable to improve the heat exchange characteristics by attaching a protrusion such as a fin or a turbulence promotion body on the outer wall or an inner wall of the heat exchanger flow paths 9. The heat exchanger flow path 9 may be a circular pipe, an elliptical pipe, a rectangular pipe, a flat pipe, a configuration in which a part of the circular pipe is depressed, a corrugated pipe, or the like.

Figure 5:
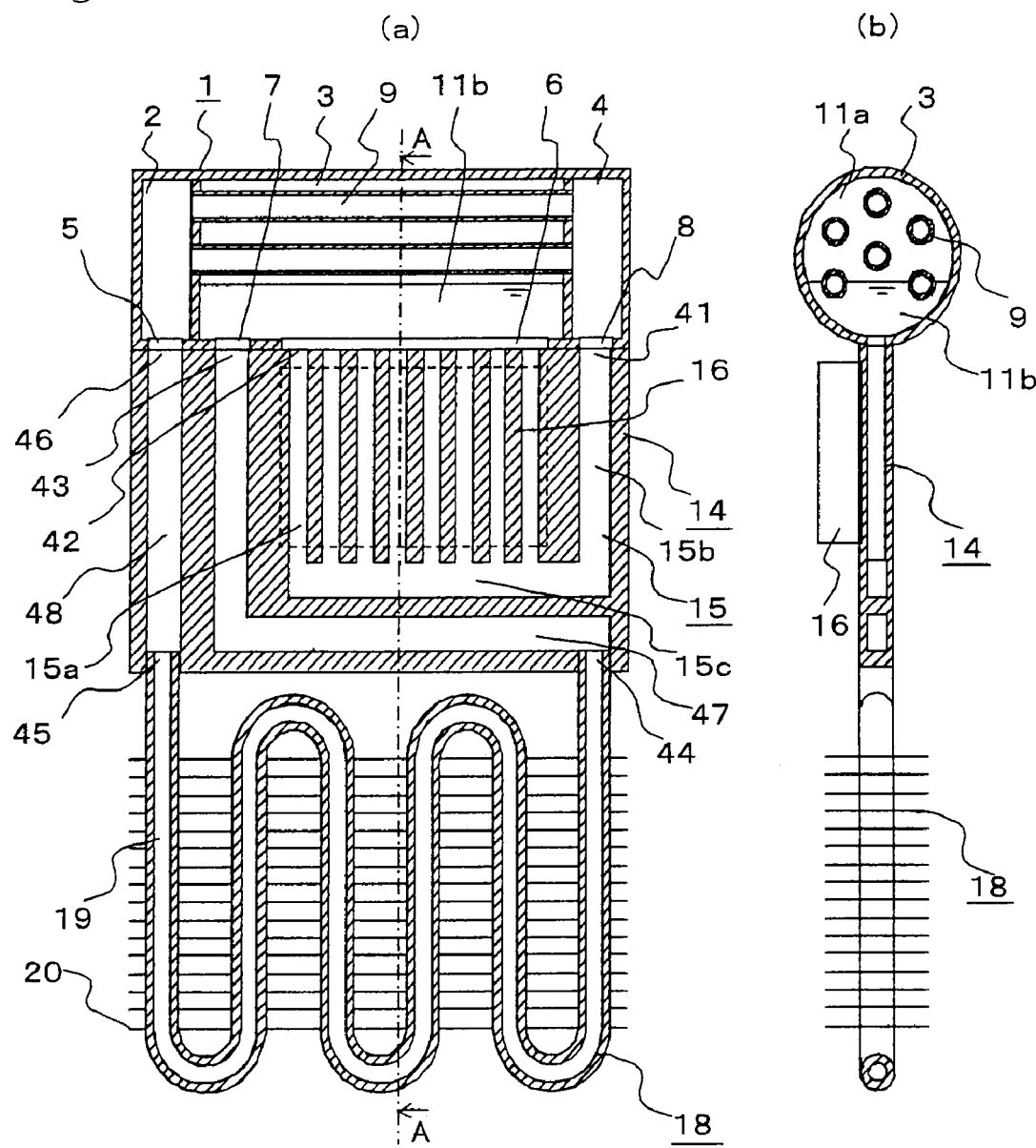
FIG. 5 is a cross-sectional view showing a configuration of other cooling apparatus according to Embodiment 1 of the present invention.
Figure 6:
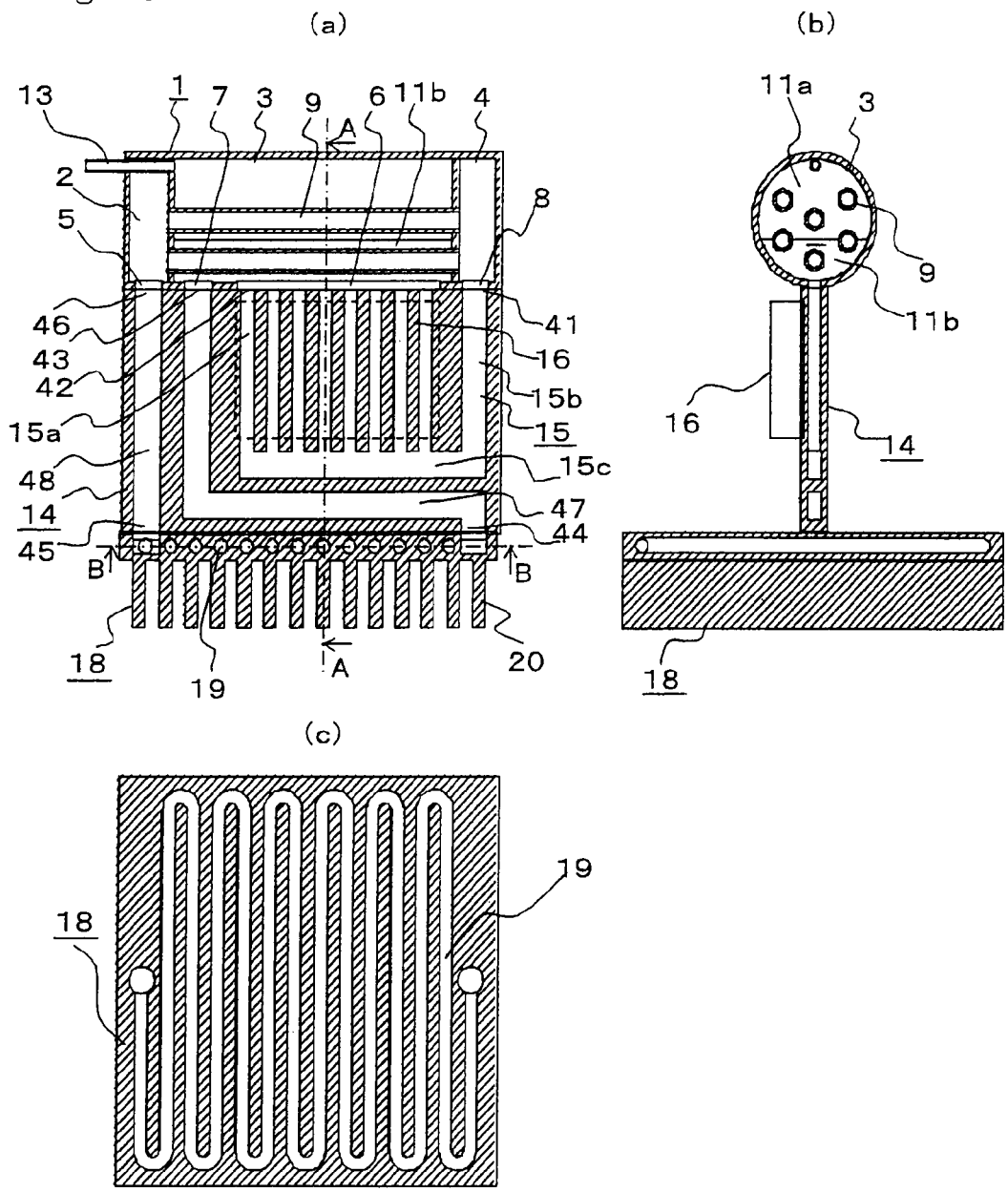
FIG. 6 is a cross-sectional view showing a configuration of other cooling apparatus according to Embodiment 1 of the present invention.
Figure 7:
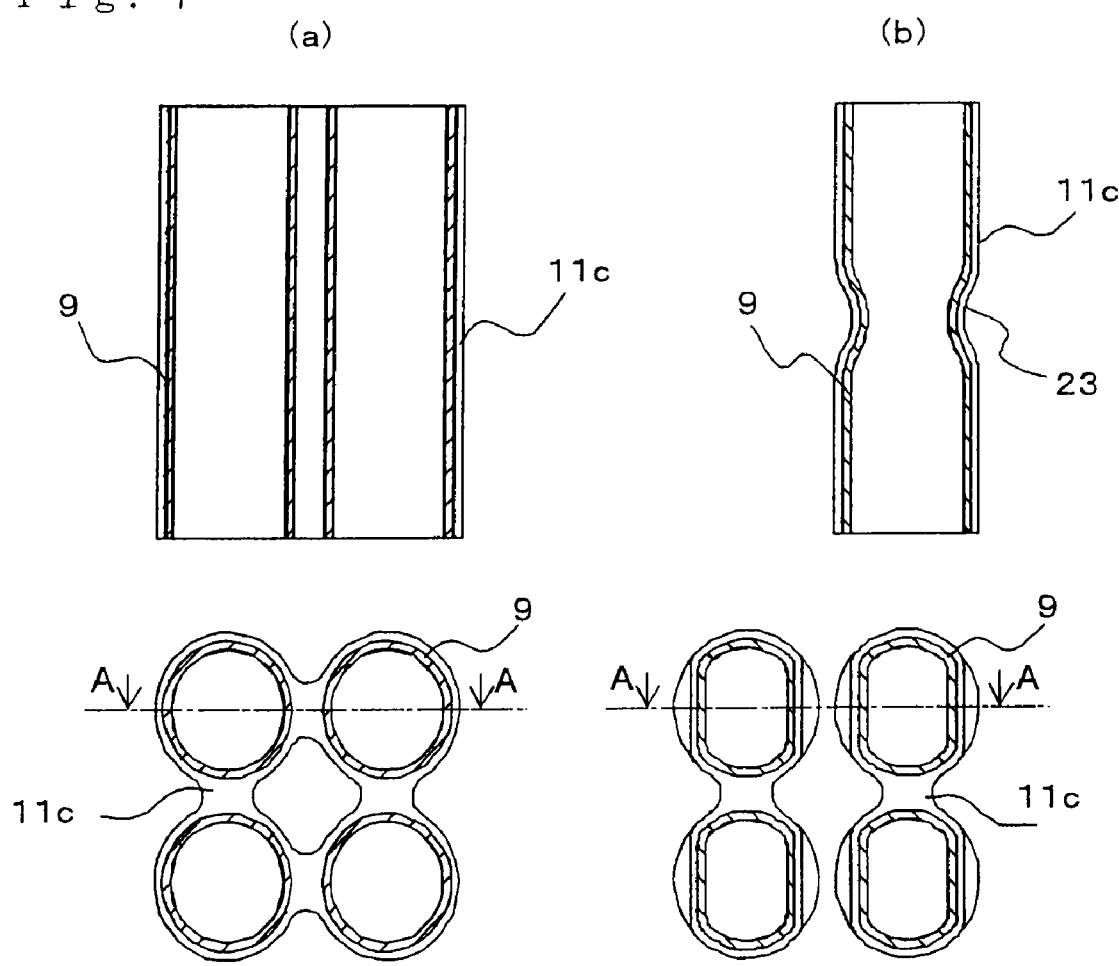
FIG. 7 is a cross-sectional configuration view showing a heat exchanger flow path according to Embodiment 1 of the present invention.

FIG. 2 to FIG. 6 are cross-sectional views showing other configurations of cooling apparatuses according to Embodiment 1 of the present invention. FIG. 2(b) is a cross-sectional view in the cross section A-A shown in FIG. 2(a); and FIG. 2(c) is a cross-sectional view in the cross section B-B shown in FIG. 2(a). Furthermore, FIG. 3(b) is a cross-sectional view in the cross section A-A shown in FIG. 3(a); FIG. 4(b) is a cross-sectional view in the cross section A-A shown in FIG. 4(a); and FIG. 5(b) is a cross-sectional view in the cross section A-A shown in FIG. 5(a). Further, FIG. 6(b) is a cross-sectional view in the cross section A-A shown in FIG. 6(a); and FIG. 6(c) is a cross-sectional view in the cross section B-B shown in FIG. 6(a). Furthermore, FIG. 7 is a cross-sectional view of a heat exchanger flow path according to Embodiment 1 of the present invention.

First, the cooling apparatus according to Embodiment of the present invention shown in FIG. 2 will be described. In the cooling apparatus shown in FIG. 1, the containing unit 3 has the heat exchanger high temperature liquid outlet 7, to which the heat radiator flow path 19 of the heat radiator 18 is connected, at the undersurface. In the cooling apparatus shown in FIG. 2, a containing unit 3 has a heat exchanger high temperature liquid outlet 7 at a joint portion with an evaporator 14. Furthermore, the evaporator 14 has an evaporator high temperature liquid outlet 44, to which a heat radiator flow path 19 of a heat radiator 18 is connected, at a side surface thereof; an evaporator high temperature liquid inlet 43, to which a circulating liquid is fed from the containing unit 3, at a joint portion with a heat exchanger 1 in opposition to the heat exchanger high temperature liquid outlet 7; and a high temperature liquid flow path 47, which communicates the evaporator high temperature liquid inlet 43 and the evaporator high temperature liquid outlet 44, in the inside. A high temperature circulating liquid 11b contained in the containing unit 3 is fed to the high temperature liquid flow path 47 through the heat exchanger high temperature liquid outlet 7 and the evaporator high temperature liquid inlet 43, and is delivered to the heat radiator 18 after flowing in the evaporator high temperature liquid outlet 44.

Figure 2:
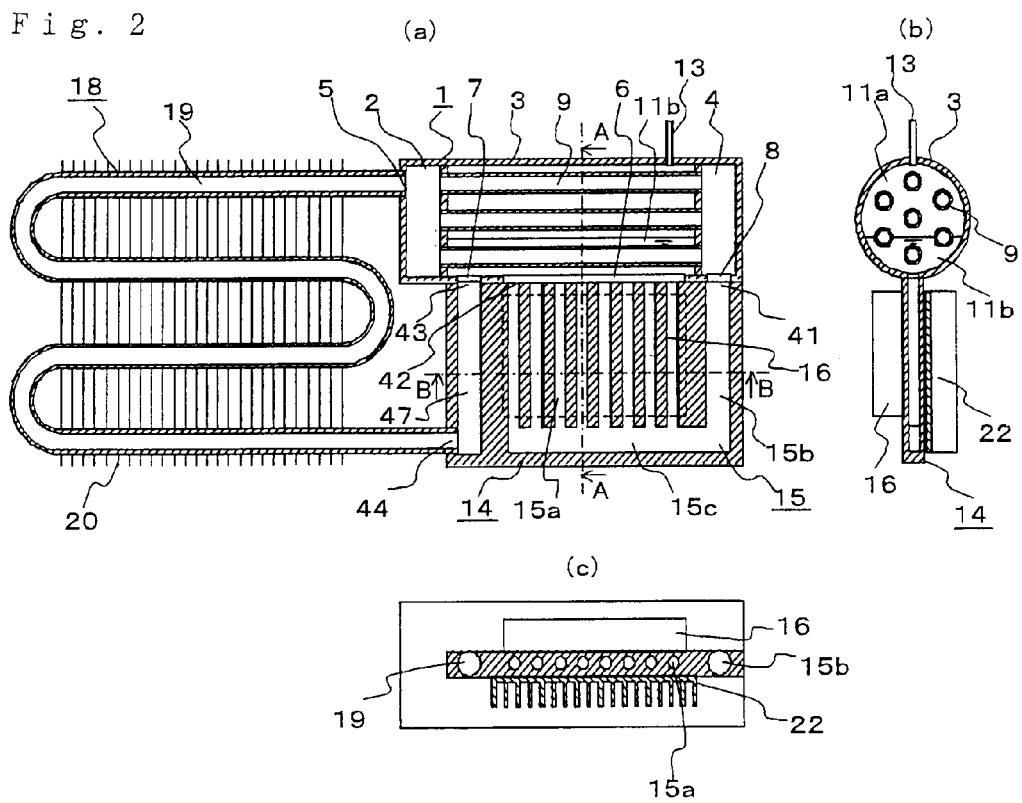
FIG. 2 is a cross-sectional view showing a configuration of other cooling apparatus according to Embodiment 1 of the present invention.

Therefore, in the cooling apparatus shown in FIG. 2, the number of connection points at bent portions in mid-flow of the heat radiator flow path 19 can be decreased than that of the cooling apparatus shown in FIG. 1; an area of the joint portion between the heat exchanger 1 and the evaporator 14 can be further increased; and strength and quake resistance are further improved and reliability is improved. Furthermore, in the cooling apparatus shown in FIG. 1, the face in which the heat exchanger low temperature liquid inlet 5 is disposed and the face in which the heat exchanger high temperature liquid outlet 7 is disposed are orthogonal; and therefore, it is difficult to mount by correctly positioning the both ends of the heat radiator flow path 19. However, in the cooling apparatus shown in FIG. 2, a face in which a heat exchanger low temperature liquid inlet 5 is disposed and a face in which the evaporator high temperature liquid outlet 44 is disposed are parallel; and therefore, the both ends of the heat radiator flow path can be easily mounted. In addition, the high temperature liquid flow path 47 is made up of a plurality of small diameter flow paths; and accordingly, the evaporator 14 can also be further reduced in size and in weight without increasing joint portions.

Furthermore, the cooling apparatus is a structure in which residual gas immanent in the beginning, residual gas contained in the circulating liquid to be filled, or gas generated in the beginning from a portion in contact with a liquid in the apparatus are accumulated in an upper portion of the containing unit 3. Therefore, in FIG. 2, a pipe-shaped sealing port 13 is provided at the upper portion of the containing unit 3 so as to communicate with the environmental space. The cooling apparatus is exhausted under vacuum from the sealing port 13, the circulating liquid is appropriately filled, and then, degasifying is carried out and sealing is made after a temporal operation; and accordingly, an amount of the inside noncondensing gas is reduced, heat radiation characteristics are improved, and stable operation can be achieved. Furthermore, each processing of vacuum evacuation, filling of liquid, and residual gas discharge can be carried out by one port; and therefore, the above mentioned processing can be implemented without increasing the number of components. In addition, a connection pipe having a number of openings is mounted to the sealing port 13, and this is used as an airtightness checking port, a vacuum evacuation port, a circulating liquid filling port, a degassing port, and the like; and accordingly, workability is considerably improved. Even when the sealing port 13 is provided in the cooling apparatus shown in FIG. 1, the same effect can be deservingly obtained. Furthermore, the structure tends to accumulate the noncondensing gas in the upper side of the containing unit 3; and therefore, there may be provided a space for accumulating the noncondensing gas in the upper portion of the containing unit 3 without providing the heat exchanger flow paths 9.

Further, in the cooling apparatus shown in FIG. 2, an auxiliary heat radiator 22 which emits heat of the heating element 16 is arranged on a face on the opposite side to a face in which a heating element 16 of the evaporator 14 is disposed. Since the cooling apparatus does not operate if boiling of the circulating liquid is not possible in an evaporator flow path 15, the cooling apparatus does not operate in the case where a heat release value of the heating element 16 does not reach an amount of heat to boil the circulating liquid (during low heat generation); on the contrary, the temperature of the heating element 16 becomes higher than the case where the heat release value of the heating element 16 is the amount of heat to boil the circulating liquid (during high heat generation). Consequently, during the low heat generation, the amount of heat necessary to be emitted is relatively small; and therefore, the heat of the heating element 16 can be properly emitted by providing the auxiliary heat radiator 22 on the face on the opposite side to the face in which the heating element 16 of the evaporator 14 is disposed.

In addition, in contrast to FIG. 1, in FIG. 2, the position of the heat exchanger low temperature liquid inlet 5 is arranged at an upper portion than the central axis of the heat exchanger 1. Therefore, a larger heat radiator 18 can be provided, and the heat radiation characteristics can be further improved. The other configuration and function are the same as that of the cooling apparatus shown in FIG. 1.

Figure 3:
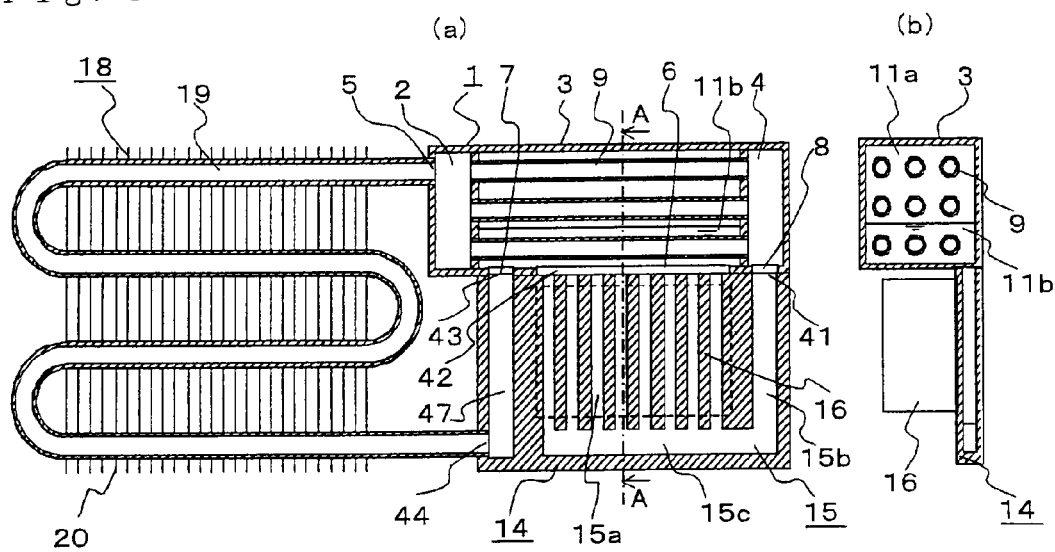
FIG. 3 is a cross-sectional view showing a configuration of other cooling apparatus according to Embodiment 1 of the present invention.

Next, the cooling apparatus according to Embodiment 1 of the present invention shown in FIG. 3 will be described. In the cooling apparatus shown in FIG. 2, an outer shape of the heat exchanger 1 is cylindrical column; however, in the cooling apparatus shown in FIG. 3, an outer shape of the heat exchanger 1 is rectangular solid (cross-sectional shape is rectangle). Furthermore, the cooling apparatus shown in FIG. 3 does not have the sealing port 13 and the auxiliary heat radiator 22. The outer shape of the heat exchanger 1 is the rectangular solid; and therefore, a heat exchange area per unit volume (for example, number) of the heat exchanger flow paths 9 can be larger than that of the columnar heat exchanger 1, heat exchange characteristics through the heat exchanger flow paths 9 are improved, and heat radiation characteristics of the cooling apparatus can be improved.

Furthermore, as shown in FIG. 3(b), the center line of an evaporator 14 is deviated from the center line of the heat exchanger 1 and an offset arrangement is made; and therefore, a large space can be made in the lower side of the heat exchanger 1 and on the side surface side of the evaporator 14, a heating element 16 can be effectively contained in this space, and the cooling apparatus can be reduced in size. The other configuration and function are the same as that of the cooling apparatus shown in FIG. 2.

Figure 4:
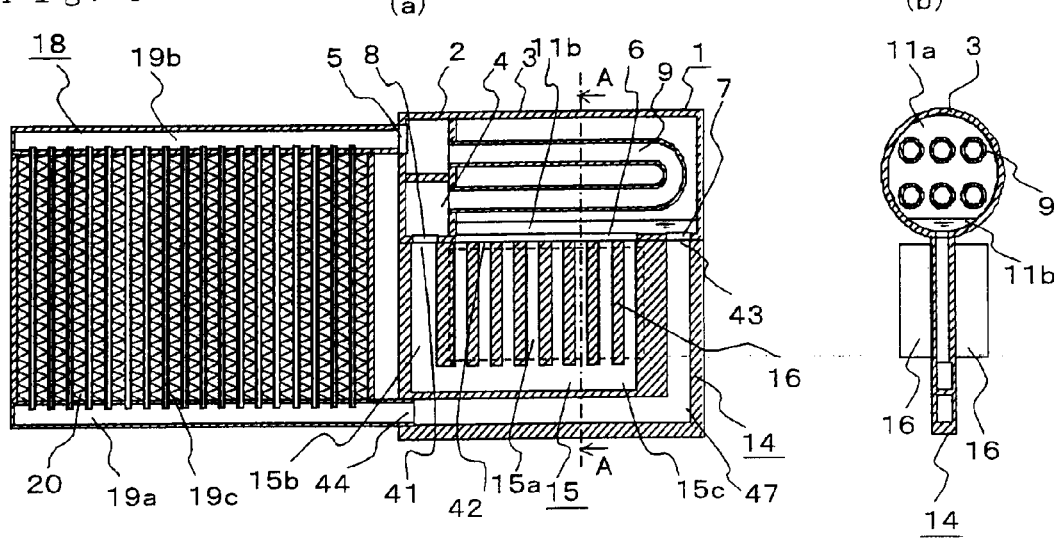
FIG. 4 is a cross-sectional view showing a configuration of other cooling apparatus according to Embodiment 1 of the present invention.

The cooling apparatus according to Embodiment 1 of the present invention shown in FIG. 4 will be described. In the cooling apparatus shown in FIG. 2, the straight pipe shaped heat exchanger flow paths 9 which link the inlet header 2 and the outlet header 4 are arranged in the containing unit 3. In the cooling apparatus shown in FIG. 4, an inlet header 2 is arranged at the upper side of one side surface of a containing unit 3, an outlet header 4 is arranged at the lower side thereof, and a U-shaped heat exchanger flow path 9 which links the inlet header 2 and the outlet header 4 is arranged in the containing unit 3. Therefore, the cooling apparatus can be reduced in size; and an outer container of a heat exchanger 1 is die formed, interpolation members (for example, partition plates among the inlet header 2, the containing unit 3, and outlet header 4; and the heat exchanger flow paths 9) are attached by inserting in the outer container; and accordingly, manufacturing can be easier and airtightness is also improved.

Furthermore, in a heat radiator 18, a heat radiator flow path 19 is composed of parallel flow paths 19c made up of a plurality of flat pipes; and a plurality of fins 20 which are for radiating heat are provided between the plurality of the parallel flow paths 19c. Further, the heat radiator 18 has a diverging header 19a by which a circulating liquid is diverged to the upstream of the plurality of the parallel flow paths 19c; and a converging header 19b on which the circulating liquid is converged from the downstream of the plurality of the parallel flow paths 19c. The circulating liquid delivered from an evaporator 14 flows in order in the diverging header 19a, the parallel flow paths 19c, and the converging header 19b; and then, delivered to the inlet header 2 of the heat exchanger 1. A pressure loss in the heat radiator 18 shown in FIG. 4 lowers as compared with that in the heat radiator 18 shown in FIG. 2; and consequently, heat radiation characteristics are improved. Therefore, it is possible to reduce size. Furthermore, a portion where the fins 20 of the heat radiator 18 shown in FIG. 2 are not provided does not contribute much to the heat radiation. Further, air flows only at this portion (bypass flow is generated) and the heat radiation characteristics deteriorate; and therefore, it is necessary to have a scheme for preventing the portion from generating the bypass flow. In the heat radiator 18 shown in FIG. 4, there is no space to generate the bypass flow; and therefore, the heat radiation characteristics are improved.

Further, the evaporator 14 is provided with heating elements 16 on both side surfaces thereof; and therefore, more heating elements 16 can be mounted. The other configuration and function are the same as that of the cooling apparatus shown in FIG. 2.

The cooling apparatus according to Embodiment 1 of the present invention shown in FIG. 5 will be described. In FIG. 5, an inlet header 2 has a heat exchanger low temperature liquid inlet 5 at a joint portion with an evaporator 14; and the evaporator 14 has an evaporator low temperature liquid inlet 45 and an evaporator high temperature liquid outlet 44, to those of which a heat radiator flow path 19 of a heat radiator 18 is linked at an undersurface thereof. Furthermore, the evaporator 14 has an evaporator low temperature liquid outlet 46 at a joint portion with a heat exchanger 1 in opposition to the heat exchanger low temperature liquid inlet 5, and has a low temperature liquid flow path 48 which communicates the evaporator low temperature liquid inlet 45 and the evaporator low temperature liquid outlet 46. A circulating liquid delivered from the heat radiator 18 flows in order in the evaporator low temperature liquid inlet 45, the low temperature liquid flow path 48, the evaporator low temperature liquid outlet 46, and the heat exchanger low temperature liquid inlet 5; and then, fed to the inlet header 2. The other configuration and function are the same as the cooling apparatus shown in FIG. 2.

In the cooling apparatus shown in FIG. 5, the inlet header 2 has the heat exchanger low temperature liquid inlet 5 at the joint portion with the evaporator 14, and has the evaporator low temperature liquid outlet 46 at the joint portion with the heat exchanger 1 in opposition to the heat exchanger low temperature liquid inlet 5; and therefore, an area of the joint portion between the heat exchanger 1 and the evaporator 14 can be further improved; and consequently, strength and quake resistance are further improved and reliability is improved. Furthermore, the evaporator low temperature liquid inlet 45 and the evaporator high temperature liquid outlet 44 are arranged at the same face; and therefore, the both end sides of the heat radiator flow path 19 can be easily mounted.

Furthermore, in the cooling apparatus shown in FIG. 5, a heat exchanger flow paths 9 is not provided in the vicinity of a two-phase fluid inlet 6; but, the heat exchanger flow paths 9 are arranged in the upper side of a containing unit 3. For this reason, a high temperature circulating liquid 11b fed from the two-phase fluid inlet 6 is decelerated, and then, the high temperature circulating liquid 11b is impinged against an inner wall of the containing unit 3 or against outer walls of the heat exchanger flow paths 9; and therefore, resistance to corrosion, strength, and quake resistance of the heat exchanger 1 can be improved. Furthermore, a pressure loss in the two-phase fluid inlet 6 is reduced and flow rate of the circulating liquid flowing in a circulation flow path is increased; and therefore, heat radiation characteristics of the cooling apparatus can be improved.

The cooling apparatus according to Embodiment 1 of the present invention shown in FIG. 6 will be described. In FIG. 6, there is included a plate-like heat radiator 18 in which one meandered heat radiator flow path 19 is provided in the inside and fins 20 are provided on the outside; and it is configured such that a face parallel to a flow direction of a circulating liquid flowing in the heat radiator flow path 19 and a face parallel to a flow direction of the circulating liquid flowing in the evaporator flow path 15 are orthogonal. Therefore, the height of the cooling apparatus shown in FIG. 5 can be lower than that of the cooling apparatus.

Furthermore, as shown in FIG. 6, a sealing port 13 may be provided so as to communicate the inside of a containing unit 3 and the environment through an inlet header 2. Furthermore, in the cooling apparatus shown in FIG. 6, heat exchanger flow paths 9 are arranged at the lower side except an upper portion of the containing unit 3. For this reason, the upper portion of the containing unit 3 serves as noncondensing gas accumulation; and therefore, influence due to the noncondensing gas becomes small and the amount of allowable noncondensing gas becomes large. The other configuration and function are the same as that of the cooling apparatus shown in FIG. 5.

A heat exchanger flow path 9 of the cooling apparatus according to Embodiment 1 of the present invention shown in FIG. 7 will be described. The heat exchanger flow path 9 shown in FIG. 7(a) is a straight pipe; if a plurality of heat exchanger flow paths 9 are adjacently provided, condensate liquids 11c formed on the outside of the heat exchanger flow paths 9 link; thus, a bridge of the condensate liquids 11c which block movement of vapor 11a is formed around the heat exchanger flow paths 9. Therefore, a heat exchange area in which the vapor 11a comes in contact with the heat exchanger flow paths 9 becomes small, and heat exchange characteristics deteriorate. Since the heat exchanger flow path 9 shown in FIG. 7(b) is provided with a recess 23 on its outer wall, a gap between the heat exchanger flow paths 9 become nonuniform, and it becomes easy that the condensate liquid 11c flows down through a large portion of the gap. For this reason, it becomes difficult to form the bridge of the condensate liquid 11c around the heat exchanger flow paths 9, the heat exchange area does not become small, and the heat exchange characteristics do not deteriorate. Therefore, it becomes effective if the recess 23 is provided in the case where the heat exchanger flow paths 9 are adjacently provided.

Embodiment 2

Figure 8:
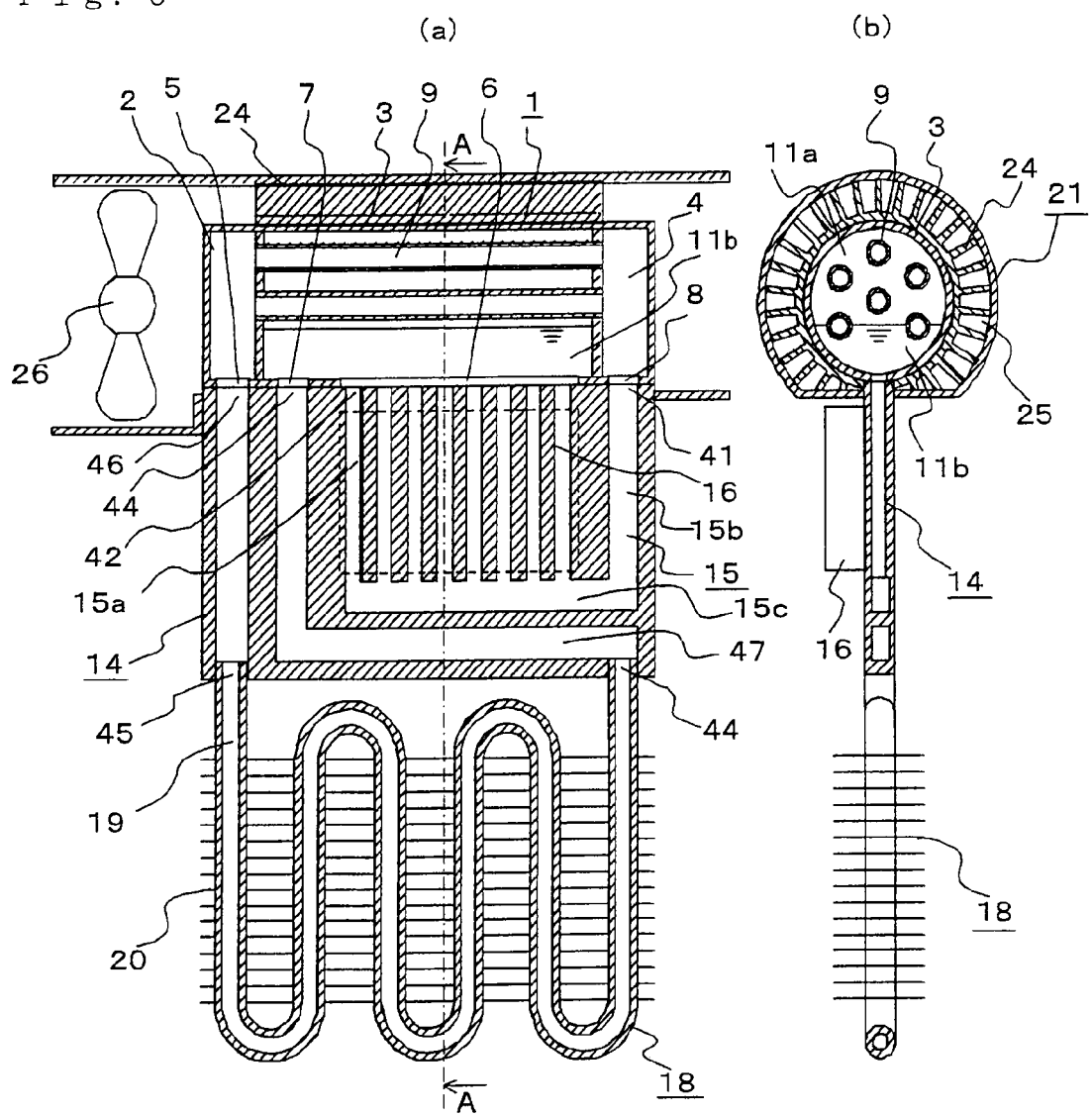
FIG. 8 is a cross-sectional view showing a configuration of a cooling apparatus according to Embodiment 2 of the present invention.

FIG. 8 is a cross-sectional view showing a configuration of a cooling apparatus according to Embodiment 2 of the present invention; and FIG. 8(b) is a cross-sectional view in the cross section A-A shown in FIG. 8(a).

In the cooling apparatus according to the present Embodiment 2, it is configured such that a heat exchanger heat radiation unit 21 is provided on a heat exchanger 1 in addition to a heat radiator 18 to improve heat radiation characteristics of the cooling apparatus and to be able to stably radiate heat in the case where a heat release value generated in a heating element 16 is small.

In FIG. 8, the heat exchanger heat radiation unit 21 has fins 24 provided around the outside of a containing unit 3, heat exchanger cooling flow paths 25 provided between the fins 24, and a fan 26 which delivers a cooling fluid to the heat exchanger cooling flow paths 25. Therefore, a part of heat applied from the heating element 16 can be radiated, and the heat radiation characteristics of the cooling apparatus can be further improved. Air or liquid is used as the cooling fluid, and in the case where a liquid is used as the cooling fluid, a pump may be installed in place of the fan 26. In FIG. 8, the fan 26 (or pump) is installed at an upstream of the cooling flow path; however, it may be installed at a downstream thereof. In the case where the cooling apparatus is installed in a mobile body such as vehicles, blowing wind may be used without installing the fan 26 or the pump. The other configuration and function are the same as that of the cooling apparatus shown in FIG. 5.

In the cooling apparatus, in the case where a heat release value of the heating element 16 does not reach an amount of heat to boil a circulating liquid (during low heat generation), the circulating liquid does not circulate in a circulation flow path. Furthermore, also in the case where a high temperature circulating liquid 11b circulates between a plurality of heated flow paths 15a (movement of the circulating liquid is generated only in adjacent heated flow paths 15a), the circulating liquid does not circulate in the circulation flow path. However, even in the both cases, the high temperature circulating liquid 11b and vapor in an evaporator flow path 15 surely flow into the containing unit 3; and therefore, the heat applied from the heating element 16 can be radiated to the environment by providing the heat exchanger heat radiation unit 21 on the containing unit 3 as in the cooling apparatus shown in the present Embodiment 2. Furthermore, since an increase in saturation pressure in the containing unit 3 can be suppressed by providing the heat exchanger heat radiation unit 21 on the containing unit 3, a difference between a saturation temperature corresponding to the saturation pressure and a temperature on wall surfaces of the heated flow paths 15a in a evaporator 14 becomes large; and consequently, it becomes easy to boil the high temperature circulating liquid 11b contained in the heated flow paths 15a and to circulate the circulating liquid in the circulation flow path.

In the cooling apparatus shown in FIG. 8, the fins 24 of the heat exchanger heat radiation unit 21 are provided around the containing unit 3; however, the fins 24 may be also provided on the inlet header 2 and the outlet header 4. Furthermore, the heat exchanger heat radiation unit 21 may be any one as long as the heat applied from the wall of the heat exchanger 1 can be radiated to the cooling fluid; and its shape, size, structure, and the like are not particularly constrained.

Figure 9:
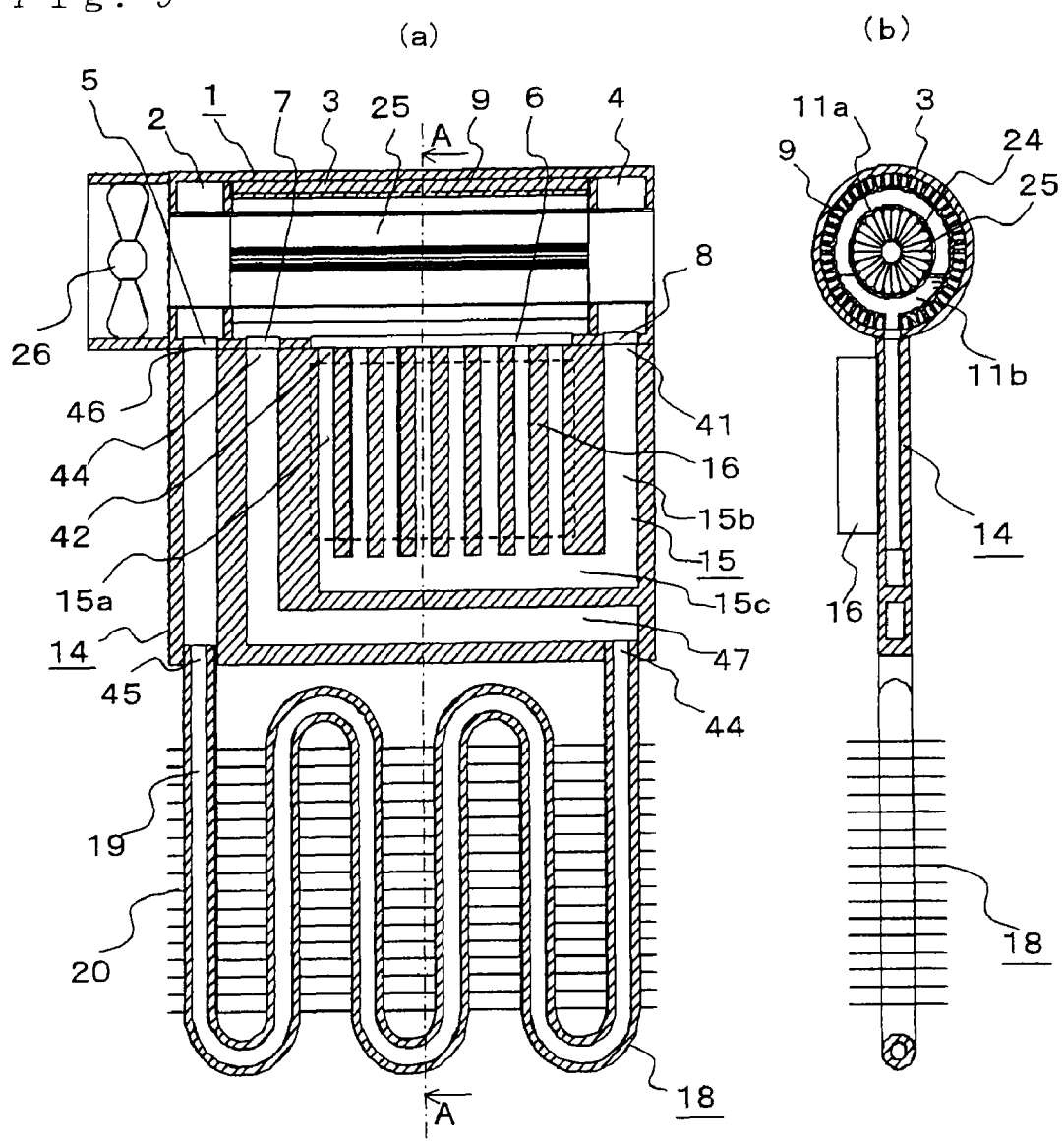
FIG. 9 is a cross-sectional view showing a configuration of other cooling apparatus according to Embodiment 2 of the present invention.

FIG. 9 is a cross-sectional view showing other configuration of a cooling apparatus according to Embodiment 2 of the present invention; and FIG. 9(b) is a cross-sectional view in the cross section A-A shown in FIG. 9(a).

The cooling apparatus shown in FIG. 9 is one in which heat exchanger cooling flow paths 25 are provided at a central portion of a containing unit 3, and a plurality of heat exchanger flow paths 9 are provided on an outer peripheral portion of the containing unit 3. Also in the cooling apparatus shown in FIG. 9, the same effects can be obtained as in the cooling apparatus shown in FIG. 8.

Embodiment 3

Figure 10:
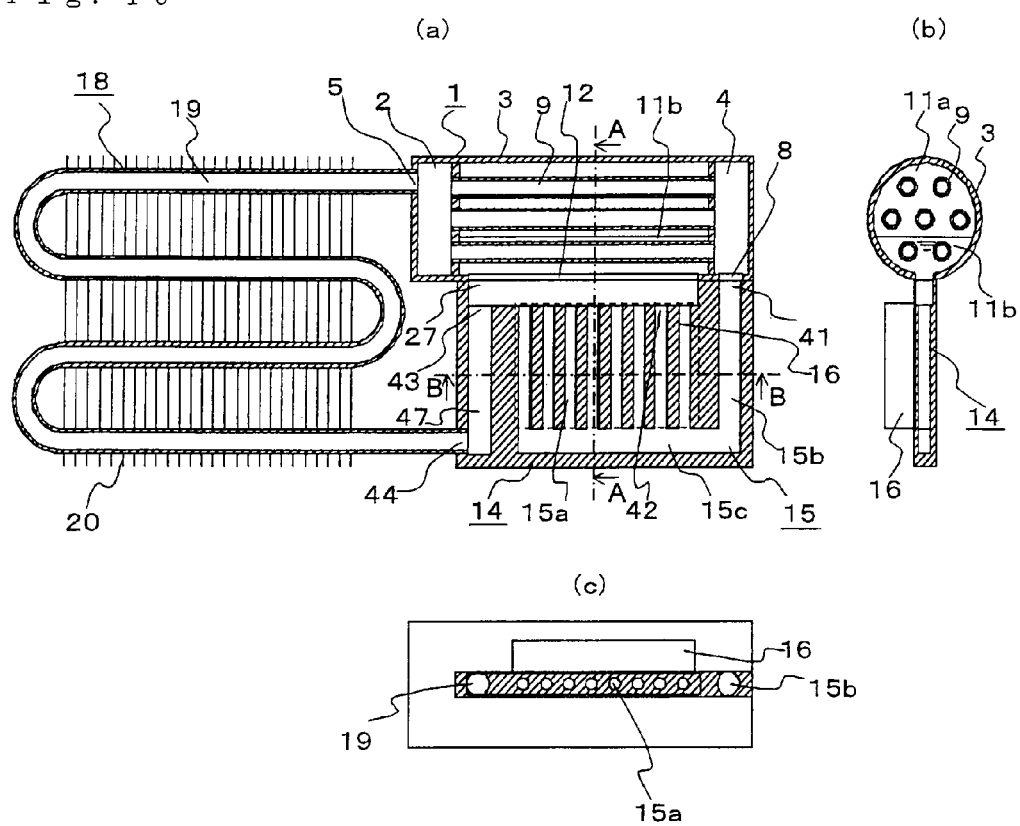
FIG. 10 is a cross-sectional view showing a configuration of a cooling apparatus according to Embodiment 3 of the present invention.

FIG. 10 is a cross-sectional view showing a configuration of a cooling apparatus according to Embodiment 3 of the present invention. FIG. 10(b) is a cross-sectional view in the cross section A-A shown in FIG. 10(a); and FIG. 10(c) is a cross-sectional view in the cross section B-B shown in FIG. 10(a).

The cooling apparatus according to the present Embodiment 3 is one in which resistance to a change in volumetric force (gravitational force such as gravity and centrifugal force) is improved in the case where the cooling apparatus is mounted in a mobile body such as vehicles. More specifically, for example, with an acceleration and deceleration of the mobile body, a vapor-liquid interface formed by a high temperature circulating liquid 11b and vapor 11a in a containing unit 3 is not horizontal, and even in the case where there generates a state that the high temperature circulating liquid 11b in the containing unit 3 does not come in contact with the heat exchanger high temperature liquid outlet 7 because the vapor-liquid interface on the mounting portion side of a heat exchanger high temperature liquid outlet 7 becomes high or low, the high temperature circulating liquid 11b can be delivered from the containing unit 3 to a heat radiator 18.

In FIG. 10, an evaporator 14 is provided with a circulating liquid holding unit 27, which is for holding the high temperature circulating liquid 11b, depressed from a joint face in a joint portion with an upper heat exchanger 1; and the evaporator 14 is provided with an evaporator high temperature liquid inlet 43 and a two-phase fluid outlet 42 in a bottom face of the circulating liquid holding unit 27. Furthermore, the heat exchanger 1 has an opening portion 12, in which a two-phase fluid inlet 6 and the heat exchanger high temperature liquid outlet 7 are integrated, in the joint portion with the evaporator 14 in opposition to the circulating liquid holding unit 27. For this reason, it is possible to further increase the height from the evaporator high temperature liquid inlet 43 to the vapor-liquid interface in the containing unit 3 without increasing a containing capacity of the high temperature circulating liquid 11b in the containing unit 3. Consequently, even in the case where there generates a state that the high temperature circulating liquid 11b in the containing unit 3 does not come in contact with the heat exchanger high temperature liquid outlet 7 (opening portion 12) because of a change in the vapor-liquid interface due to a deceleration, an acceleration, or a turning of the mobile body, the high temperature circulating liquid 11b can be delivered from the evaporator high temperature liquid inlet 43 to a heat radiator 18 through a high temperature liquid flow path 47 and an evaporator high temperature liquid outlet 44; and stable operation can be made. The other configuration and function are the same as that of the cooling apparatus shown in FIG. 2.

Figure 11:
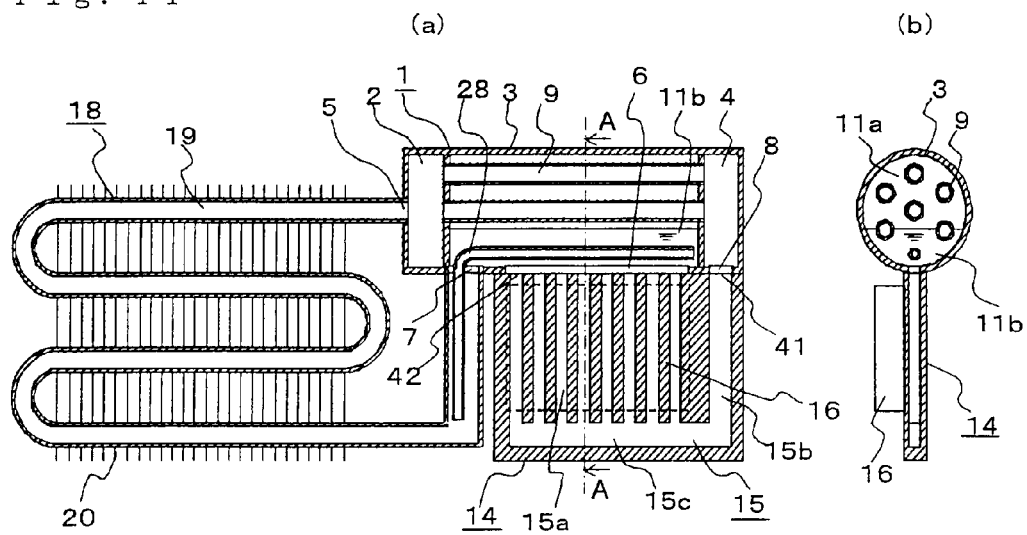
FIG. 11 is a cross-sectional view showing a configuration of other cooling apparatus according to Embodiment 3 of the present invention.
Figure 12:
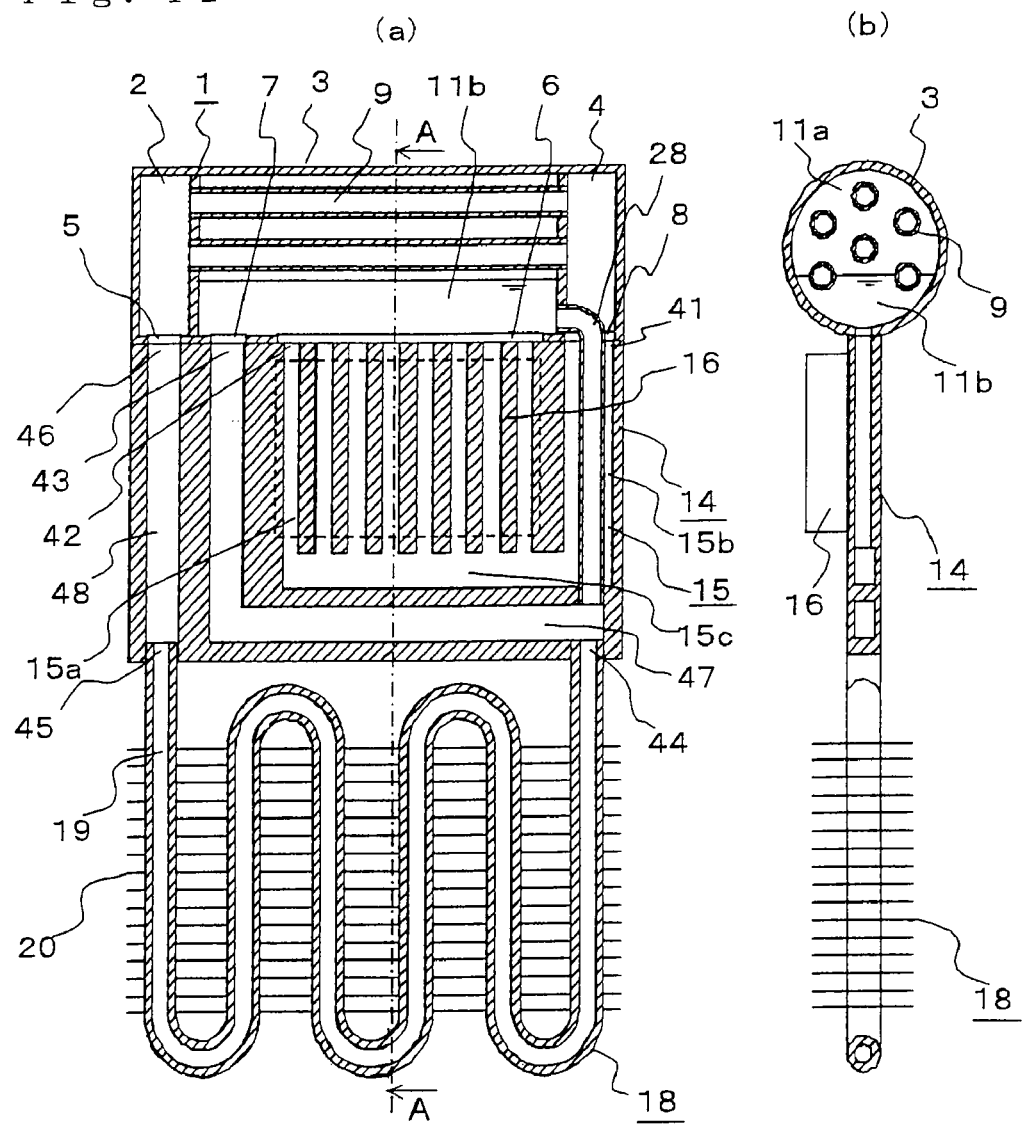
FIG. 12 is a cross-sectional view showing a configuration of other cooling apparatus according to Embodiment 3 of the present invention.
Figure 13:
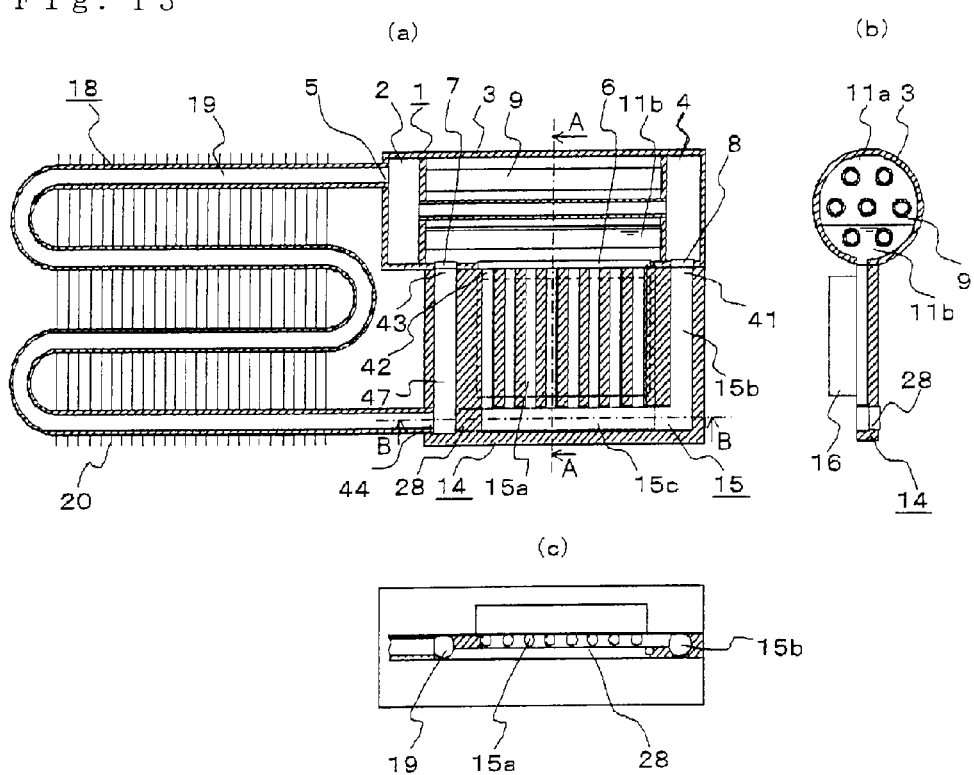
FIG. 13 is a cross-sectional view showing a configuration of other cooling apparatus according to Embodiment 3 of the present invention.

FIG. 11 to FIG. 13 are cross-sectional views showing other configurations of cooling apparatuses according to Embodiment 3 of the present invention. FIG. 11(b) is a cross-sectional view in the cross section A-A shown in FIG. 11(a); and FIG. 12(b) is a cross-sectional view in the cross section A-A shown in FIG. 12(a). Furthermore, FIG. 13(b) is a cross-sectional view in the cross section A-A shown in FIG. 13(a); and FIG. 13(c) is a cross-sectional view in the cross section B-B shown in FIG. 13(a).

The cooling apparatuses shown in FIG. 11 to FIG. 13 are configurations which stably operate even in the case where there is a larger change in vapor-liquid interface than that of the cooling apparatus shown in FIG. 10; and there is provided a bypass flow path 28 which communicates the end, which is disposed at the lower side of a containing unit 3 and on the opposite side to the end provided with a heat exchanger high temperature liquid outlet 7, and a heat radiator flow path 19 of a heat radiator 18 or a high temperature liquid flow path 47 of an evaporator 14.

In FIG. 11, the bypass flow path 28 made up of an L-shaped pipe is arranged in the lower portion of the containing unit 3 and in the heat radiator flow path 19 so as to communicate the end, which is disposed at the lower side of the containing unit 3 and on the opposite side to the end provided with the heat exchanger high temperature liquid outlet 7, and the heat radiator flow path 19 through the heat exchanger high temperature liquid outlet 7. The end of the bypass flow path 28 in the containing unit 3 is arranged at the end on the opposite side to the end provided with the heat exchanger high temperature liquid outlet 7; and therefore, it becomes possible to deliver a high temperature circulating liquid 11b to the heat radiator flow path 19 in the case where the high temperature circulating liquid 11b in the containing unit 3 does not come in contact with the heat exchanger high temperature liquid outlet 7. Furthermore, the bypass flow path 28 is not protruded to the outside of the cooling apparatus; and therefore, a connection portion is not fractured by an external force being exerted thereon; strength, quake resistance, and airtightness are improved; and reliability is improved. The other configuration and function are the same as that of the cooling apparatus shown in FIG. 1.

In FIG. 12, the bypass flow path 28 is arranged in a non-heated flow path 15b so as to communicate the end, which is disposed at the lower side of the containing unit 3 and on the opposite side to the end provided with the heat exchanger high temperature liquid outlet 7, and the high temperature liquid flow path 47 through an intermediate liquid outlet 8 and an intermediate liquid inlet 41. The other configuration and function are the same as that of the cooling apparatus shown in FIG. 5. Also in the cooling apparatus shown in FIG. 12, the same effects as that of the cooling apparatus shown in FIG. 11 can be obtained.

In FIG. 13, the L-shaped bypass flow path 28 is arranged in the evaporator 14 other than an evaporator flow path 15 and the high temperature liquid flow path 47 so as to communicate the end, which is disposed at the lower side of the containing unit 3 and on the opposite side to the end provided with the heat exchanger high temperature liquid outlet 7, and the high temperature liquid flow path. The other configuration and function are the same as that of the cooling apparatus shown in FIG. 2. Also in the cooling apparatus shown in FIG. 13, the same effects as that of the cooling apparatus shown in FIG. 11 can be obtained.

In addition, in the cooling apparatuses shown in FIG. 12 and FIG. 13, the bypass flow path 28 may be arranged so as to communicate the end, which is disposed at the lower side of the containing unit 3 and on the opposite side to the end provided with the heat exchanger high temperature liquid outlet 7, and the heat radiator flow path 19 of the heat radiator 18.

Embodiment 4

Figure 14:
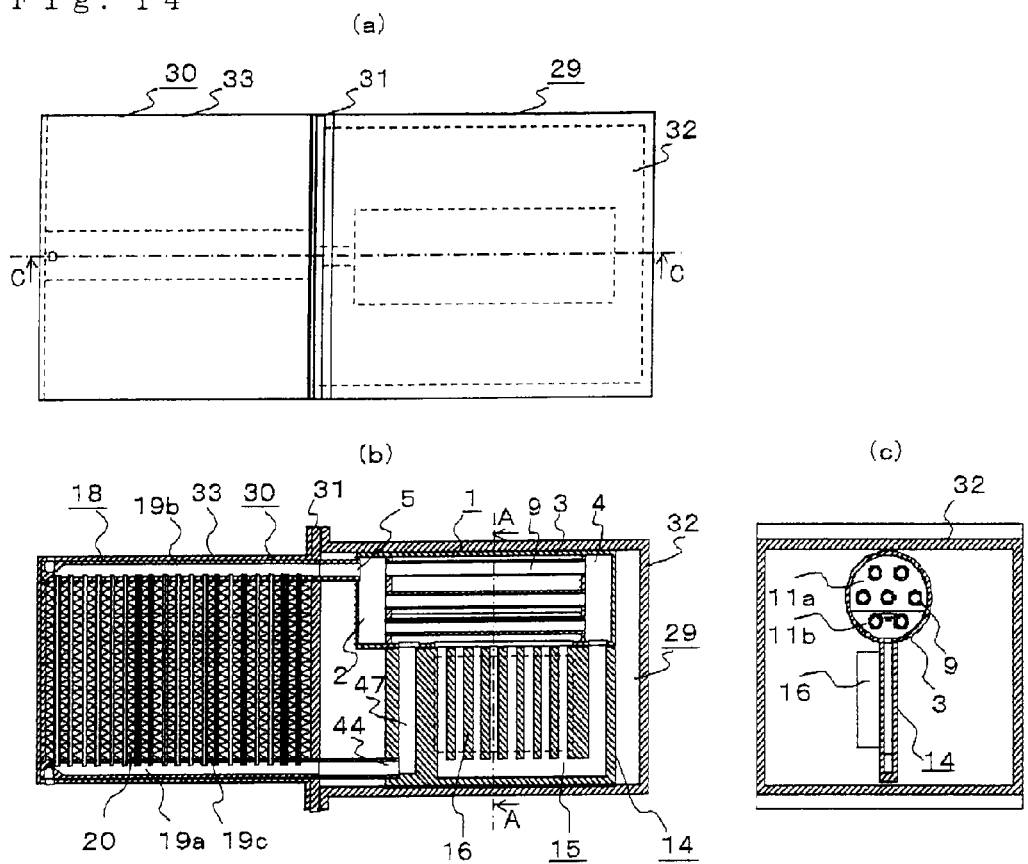
FIG. 14 is a cross-sectional view showing a configuration of a cooling apparatus according to Embodiment 4 of the present invention.

FIG. 14 is a view showing a configuration of a cooling apparatus according to Embodiment 4 of the present invention. FIG. 14(a) is a top view showing a configuration of the cooling apparatus according to Embodiment 4 of the present invention; FIG. 14(b) is a cross-sectional view in the cross section C-C shown in FIG. 14(a); and FIG. 14(c) is a cross-sectional view in the cross section A-A shown in FIG. 14(b).

The cooling apparatus according to the present Embodiment 4 is provided with a partition plate 31 which is for separating installing environment between a high temperature portion 29 and a low temperature portion 30 and is disposed therebetween, the high temperature portion 29 mainly including a heat exchanger 1, an evaporator 14, and a heating element 16; and the low temperature portion 30 mainly including a heat radiator 18. It is preferable that the high temperature portion 29 is of a waterproof and dust-proof structure in the case where the heating element is particularly an electronic apparatus; on the other hand, it is preferable that the low temperature portion 30 facilitates to flow a cooling fluid to the heat radiator 18. The partition plate 31 assumes a function to achieve at least any purpose of waterproof, dust-proof, or a cooling fluid flow path; in the case where the waterproof and dust-proof structure is required, the partition plate 31 is used as a part of a case 32 which contains the high temperature portion 29; and in the case where a flow of a low temperature cooling fluid is required, the partition plate 31 is used as a part of a sidewall of a heat radiator cooling flow path 33 which contains the low temperature portion 30.

In FIG. 14, the case 32 which contains the high temperature portion 29 is provided, and the heat radiator cooling flow path 33 which contains the low temperature portion 30 and leads the cooling fluid to the heat radiator 18. The partition plate 31 provided between the high temperature portion 29 and the low temperature portion 30 constitutes a sidewall of the case 32, and also constitutes the sidewall of the heat radiator cooling flow path 33. A heat radiator flow path 19 passes through the partition plate 31, and links a low temperature liquid inlet 5 of the heat radiator 18 and the heat exchanger 1 and an evaporator high temperature liquid outlet 44 of the evaporator 14. The other configuration and function are the same as that of the cooling apparatus shown in FIG. 4.

In addition, joint faces between the sidewall of the case 32 of the high temperature portion 29 or the heat radiator cooling flow path 33 of the low temperature portion 30 and the partition plate 31 may be provided with O-rings or gaskets, or may be fixed by adhesive or the like.

In the case where the heat radiator cooling flow path is not formed, the cooling fluid goes away to a space where there is no any pressure loss. However, in the cooling apparatus shown in FIG. 14, the heat radiator cooling flow path 33 is formed so as to flow the cooling fluid between fins 20 of the heat radiator 18; and therefore, it is possible to stably radiate heat. Furthermore, the case 32 which contains the high temperature portion 29 is provided; and therefore, it is possible to form the waterproof and dust-proof structure of the high temperature portion 29. Further, the partition plate 31 constitutes the sidewall of the case 32, and also constitutes the sidewall of the heat radiator cooling flow path 33; and therefore, manufacturing cost can be reduced. In addition, the heat radiator 18 is mounted to the heat radiator cooling flow path 33; and therefore, strength and quake resistance of the cooling apparatus are improved and reliability is improved. Further, when the heat radiator cooling flow path 33 is configured such that the cooling fluid can be flowed in a direction inclined to a vertical direction or a horizontal direction, the cooling fluid is naturally raised by the chimney effect, and it is possible to radiate heat even when a fan or the like is not provided.

Figure 15:
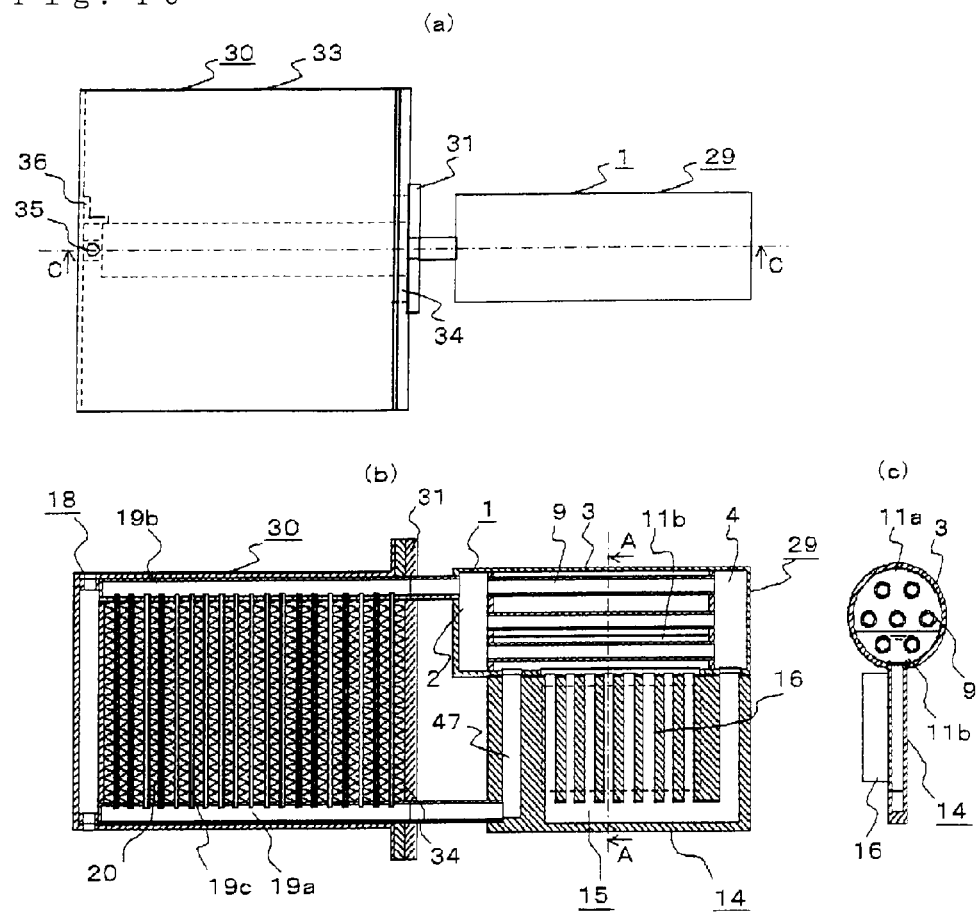
FIG. 15 is a cross-sectional view showing a configuration of other cooling apparatus according to Embodiment 4 of the present invention.
Figure 16:
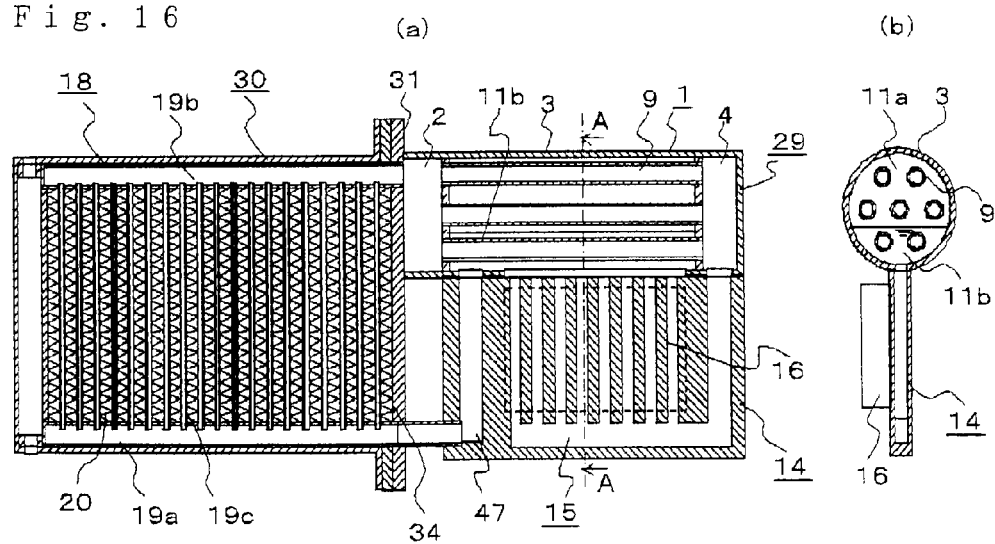
FIG. 16 is a cross-sectional view showing a configuration of other cooling apparatus according to Embodiment 4 of the present invention.
Figure 17:
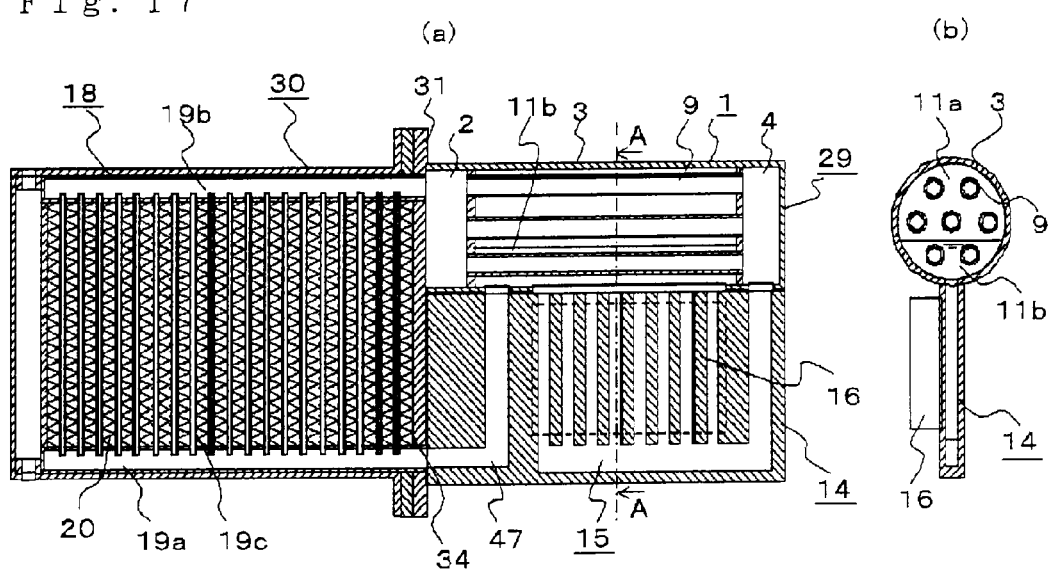
FIG. 17 is a cross-sectional view showing a configuration of other cooling apparatus according to Embodiment 4 of the present invention.

FIG. 15 to FIG. 17 are top views and cross-sectional views showing other configurations of cooling apparatuses according to Embodiment 4 of the present invention. FIG. 15(a) is a top view showing the configuration of the cooling apparatus according to Embodiment 4 of the present invention; FIG. 15(b) is a cross-sectional view in the cross section C-C shown in FIG. 15(a); and FIG. 15(c) is a cross-sectional view in the cross section A-A shown in FIG. 15(b). Furthermore, FIG. 16(b) is a cross-sectional view in the cross section A-A shown in FIG. 16(a); and FIG. 17(b) is a cross-sectional view in the cross section A-A shown in FIG. 17(a).

In FIG. 15, a partition plate 31 is provided so as to cover an opening 34 which is provided at a part of a sidewall of a heat radiator cooling flow path 33. Also in the cooling apparatus shown in FIG. 15, the same effects as in the cooling apparatus shown in FIG. 14 can be obtained.

In addition, a plurality of high temperature portions 29 may be attached by forming a plurality of openings in the sidewall of the heat radiator cooling flow path 33.

Furthermore, in FIG. 15, a heat radiator 18 is mounted to the heat radiator cooling flow path 33 through a mounting portion 35 provided at the end of the heat radiator 18. Therefore, the heat radiator 18 is supported as in the cooling apparatus shown in FIG. 14; and consequently, strength and quake resistance of the cooling apparatus are improved and reliability is improved. In the cooling apparatus shown in FIG. 15, there is provided an obstruction plate 36 which blocks a gap between the heat radiator 18 and the heat radiator cooling flow path 33, generated by providing the mounting portion 35. The obstruction plate 36 may be provided on either on the upper stream side or the lower stream side of a cooling fluid of the heat radiator 18. The obstruction plate 36 is not limited to blocking the gap generated by providing the mounting portion 35; however, for example, the obstruction plate 36 may be provided to block a gap, caused by size tolerance, between the heat radiator 18 and the heat radiator cooling flow path 33. The other configuration and function are the same as that of the cooling apparatus shown in FIG. 14.

In FIG. 16, an inlet header 2 and a partition plate are disposed by being joined, and the partition plate 31 constitutes a part of a sidewall of the inlet header 2. The other configuration and function are the same as that of the cooling apparatus shown in FIG. 14. The same effects can be obtained as in the cooling apparatus shown in FIG. 14, and heat is transferred by heat conduction from the heat exchanger 1 to the heat radiator 18 through the partition plate 31; and therefore, heat radiation characteristics of the cooling apparatus are further improved. Furthermore, since the number of components is decreased, manufacturability is improved.

In FIG. 17, an evaporator 14 and a partition plate 31 are disposed by being joined. The other configuration and function are the same as the cooling apparatus shown in FIG. 16. The same effects can be obtained as in the cooling apparatus shown in FIG. 16, and heat is transferred by heat conduction from the evaporator 14 to the heat radiator 18 through the partition plate 31; and therefore, the heat radiation characteristics of the cooling apparatus are further improved. Furthermore, the partition plate 31 serves as a reinforcement member between the heat exchanger 1 and the evaporator 14, and there is no piping between the heat radiator 18 and the heat exchanger 1 or the evaporator 14; and therefore, strength and quake resistance of the cooling apparatus are improved and reliability is improved.

In addition, as shown in FIG. 16 and FIG. 17, by joining so as to transfer the heat to the heat radiator 18 and the evaporator 14 through the partition plate 31 and the heat exchanger 1, the influence on a transient change in heat release value of a heating element 16 is moderated, and it becomes possible to reduce an overshoot (a temperature difference at a time when heat transfer in the heated flow path 15a is wrong and the temperature of the heating element 16 further increases in a state where the circulation fluid is not boiled; but, with the starting of the boiling, the heat transfer in the heated flow path 15a is improved and the temperature of the heating element 16 decreases) in temperature of the heating element 16 at starting of boiling of the circulating liquid. Furthermore, in the case where the heating element 16 begins to heat in a state where the circulating liquid in the cooling apparatus is frozen, it is easy to transfer the heat from the heating element 16 to the heat radiator 18 by heat conduction; and therefore, the frozen circulating liquid in the heat radiator flow path 19 is melted; it becomes possible to move the circulating liquid more rapidly, and operation characteristics at the time when the circulating liquid is frozen are improved.

Figure 18:
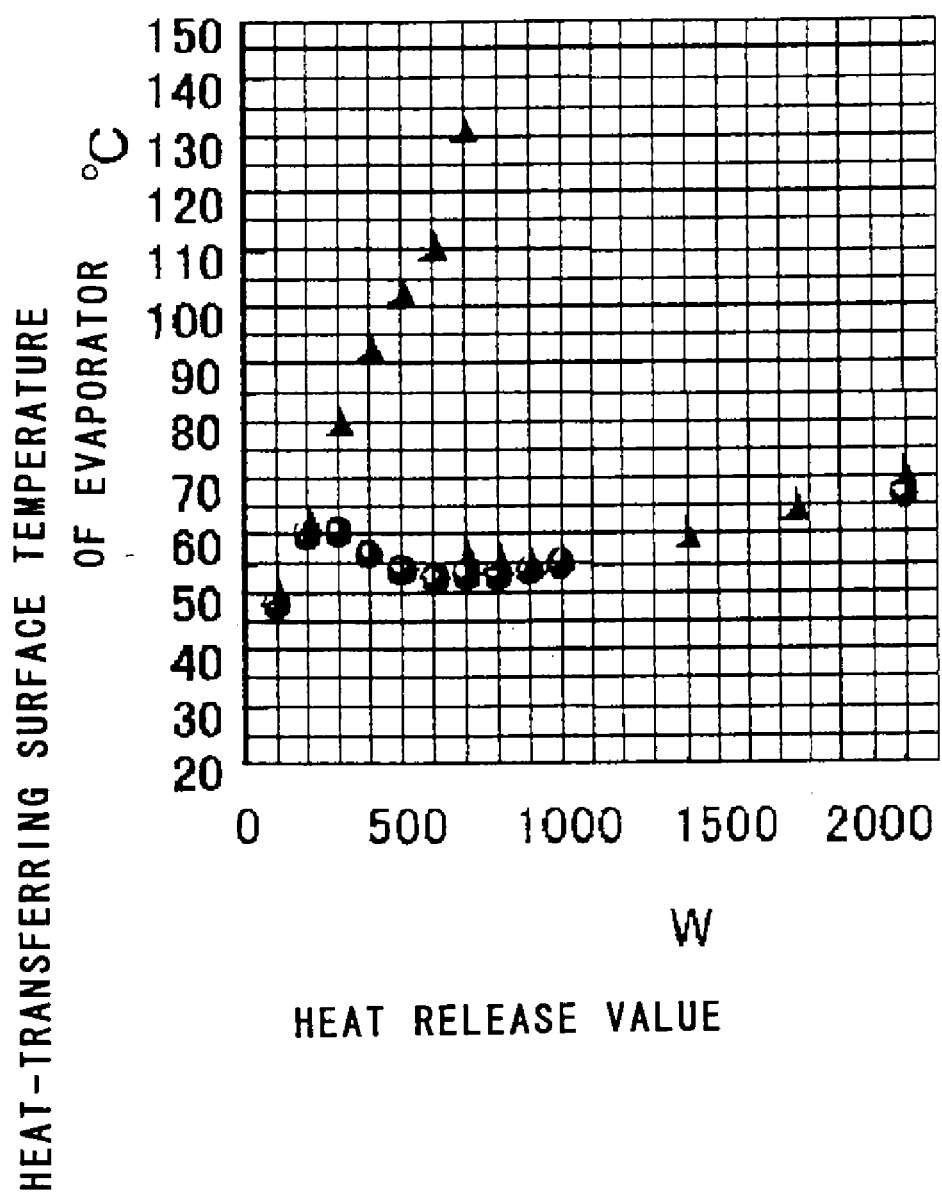
FIG. 18 is a view showing a heat-transferring surface temperature of an evaporator to thermal dose of a cooling apparatus according to Embodiment 4 of the present invention.

FIG. 18 is a view showing a heat-transferring surface temperature of the evaporator with respect to the heat release value of the heating element of the cooling apparatus according to Embodiment 4 of the present invention. In FIG. 18, marking Δ denotes a result experimented using the cooling apparatus shown in FIG. 16, and marking ○ denotes a result experimented using the cooling apparatus shown in FIG. 17.

The heat-transferring surface temperature of the evaporator of a longitudinal axis shown in FIG. 18 is a temperature at a metal portion between the heated flow path 15a and a surface of the evaporator 14; and if the temperature is high, the temperature of the heating element 16 also increases. Therefore, the heat-transferring surface temperature of the evaporator is better to be a lower temperature. As can be seen from FIG. 18, at the heat release value of 300 W to 800 W, the heat-transferring surface temperature of the evaporator of the cooling apparatus shown in FIG. 16 is largely different from the heat-transferring surface temperature of the evaporator of the cooling apparatus shown in FIG. 17; the heat-transferring surface temperatures of the evaporator of the cooling apparatus shown in FIG. 17 are lower, and the heat radiation characteristics as a water-cooling apparatus are better. Furthermore, also at any heat release value, the heat-transferring surface temperatures of the evaporator of the cooling apparatus shown in FIG. 17 are lower by approximately 3 to 5K; and also from this point, the heat radiation characteristics of the cooling apparatus shown in FIG. 17 are better. As contributing factors thereof, it is conceivable that a cooling effect due to a configuration which allows more heat to move from the evaporator 14 to the heat radiator 18 by heat conduction because the evaporator 14 and the heat radiator 18 are linked; and since the circulating liquid in the inlet header 2 and the containing unit 3 is cooled by this change in structure, a temperature of vapor 11a in the containing unit 3 decreases and a temperature (saturation temperature) difference between walls of the heated flow paths 15a and the aforementioned vapor 11a increases; and consequently, it becomes easy to boil.

Embodiment 5

Figure 19:
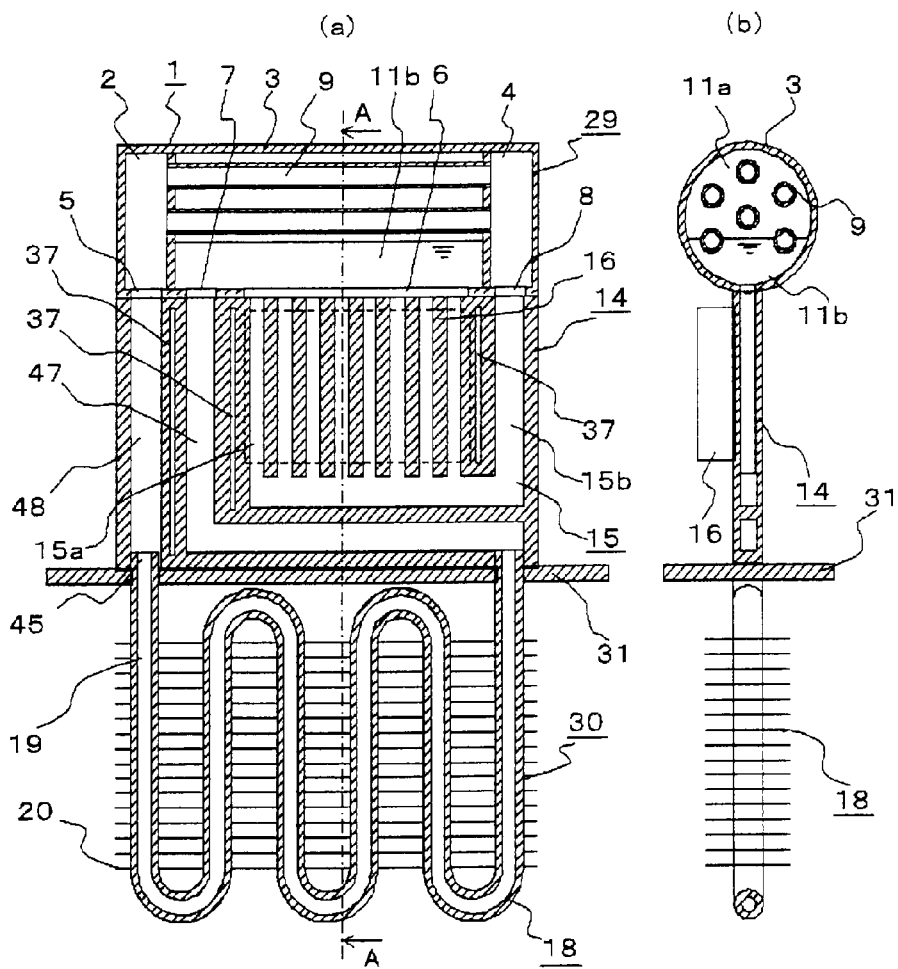
FIG. 19 is a cross-sectional view showing a configuration of a cooling apparatus according to Embodiment 5 of the present invention.

FIG. 19 is a cross-sectional view showing a configuration of a cooling apparatus according to Embodiment 5 of the present invention. FIG. 19(b) is a cross-sectional view in the cross section A-A shown in FIG. 19(a).

The cooling apparatus according to the present Embodiment 5 is provided with thermal insulation portions 37, which are for thermally insulating between an evaporator flow path 15 and a high temperature liquid flow path 47, between a high temperature liquid flow path 47 and a low temperature liquid flow path 48, and between a heated flow path 15a and a non-heated flow path 15b. Therefore, it is possible to suppress transferring of a heat from the heated flow path 15a to the non-heated flow path 15b, from the heated flow path 15a to the high temperature liquid flow path 47, and from the high temperature liquid flow path 47 to the low temperature liquid flow path 48; it is possible to suppress boiling of the circulating liquid in the high temperature liquid flow path 47, the low temperature liquid flow path 48, and the non-heated flow path 15b; and it is possible to suppress a force (buoyancy) which makes the circulating liquid move to a direction reverse to a circulation direction in circulation flow paths. The other configuration and function are the same as that of the cooling apparatus shown in FIG. 5. The thermal insulation portion 37 may be provided only any of between the evaporator flow path 15 and the high temperature liquid flow path 47, between the high temperature liquid flow path 47 and the low temperature liquid flow path 48, or between the heated flow path 15a and the non-heated flow path 15b.

In FIG. 19, the thermal insulation portion 37 is a linear groove formed so as to pass through the evaporator 14; however, the thermal insulation portion 37 is not particularly limited to this structure. The thermal insulation portion 37 may be a groove which does not pass through, a hole whose end is cut out, or one in which a thermal insulation material such as resin is embedded; and the thermal insulation portion may be any one as long as it has a shape, size, structure, or material, which blocks heat conduction between the respective flow paths.

Embodiment 6

Figure 20:
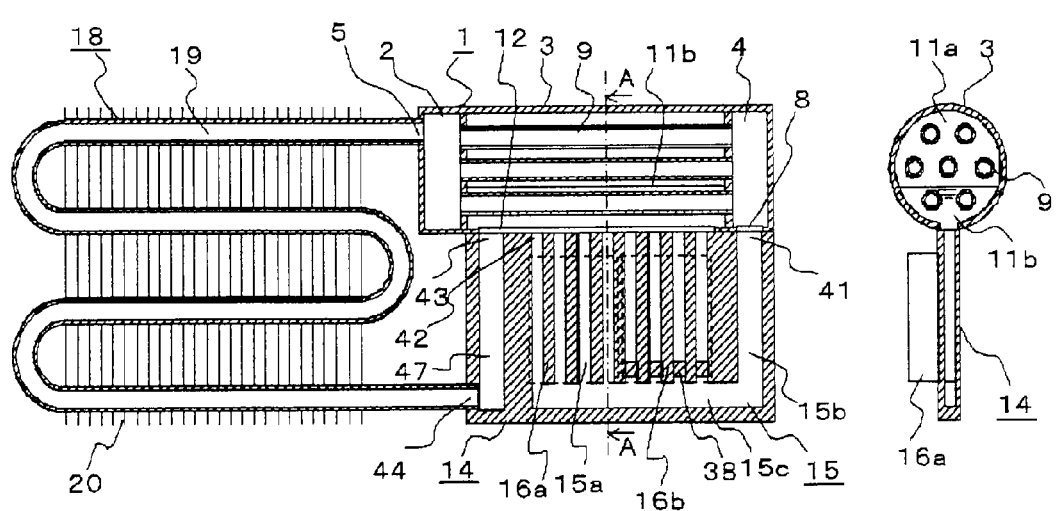
FIG. 20 is a cross-sectional view showing a configuration of a cooling apparatus according to Embodiment 6 of the present invention.

FIG. 20 is a cross-sectional view showing a configuration of a cooling apparatus according to Embodiment 6 of the present invention. FIG. 20(b) is a cross-sectional view in the cross section A-A shown in FIG. 20(a).

The cooling apparatus according to the present Embodiment 6 is provided with a plurality of heating elements 16 on an evaporator 14, and is to suppress transferring of a circulating liquid to heated flow paths 15a adjacent to a weak heating element 16b having a heat release value smaller than that of other heating element 16 in the case where the heat release values generated from the respective heating elements 16 are different.

In FIG. 20, a strong heating element 16a having a large heat release value and the weak heating element 16b having the small heat release value are mounted on the evaporator 14; and flow blocking bodies 38 which block a flow of the circulating liquid are provided in the heated flow paths 15a adjacent to the weak heating element 16b. In the case where the heat release value is too small to make the weak heating element 16b boil the circulation liquid in the heated flow paths 15a, if the flow blocking bodies 38 are not provided, there occurs a short path in which after the circulating liquid flows from a containing unit 3 to the heated flow paths 15a adjacent to the weak heating element 16b through a two-phase fluid inlet 6, the circulating liquid is fed to the heated flow paths 15a adjacent to the strong heating element 16a through a diverging header 15c, and the circulating liquid is temperature-raised to be boiled and returned again to the containing unit 3 as a gas-liquid two-phase fluid. Therefore, since the circulating liquid is not circulated in a circulation flow path, heat cannot be radiated from a heat radiator 18 to the environment; and heat radiation characteristics are considerably deteriorated. Consequently, the flow blocking bodies 38 are provided in the heated flow paths 15a adjacent to the weak heating element 16b; and accordingly, the short path of the circulating liquid is not occurred, a proper operation is secured, and heat radiation can be performed efficiently. The other configuration and function are the same as that of the cooling apparatus shown in FIG. 2.

In addition, as the flow blocking body 38, it may be any one as long as the flow of the circulating liquid is blocked; it may be a plug which cannot allow the circulating liquid to flow at all; it may be one in which a plug is provided with a small hole whose flow sectional area is smaller than the heated flow path 15a; or it may be any one of a metal mesh, a sintered metal, a foam metal, a nonwoven cloth, or the like.

Figure 21:
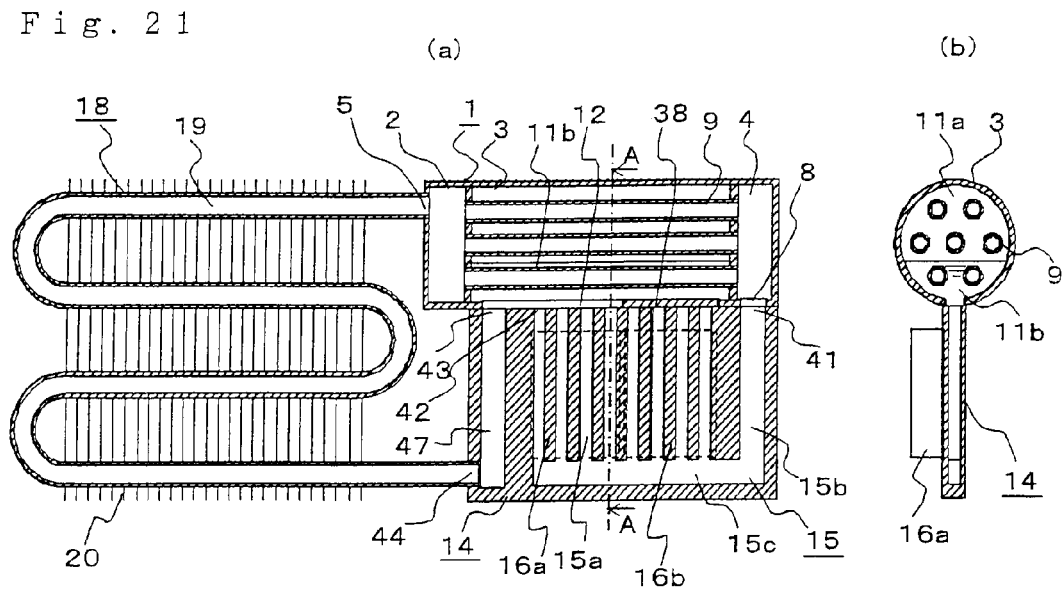
FIG. 21 is a cross-sectional view showing a configuration of other cooling apparatus according to Embodiment 6 of the present invention.
Figure 22:
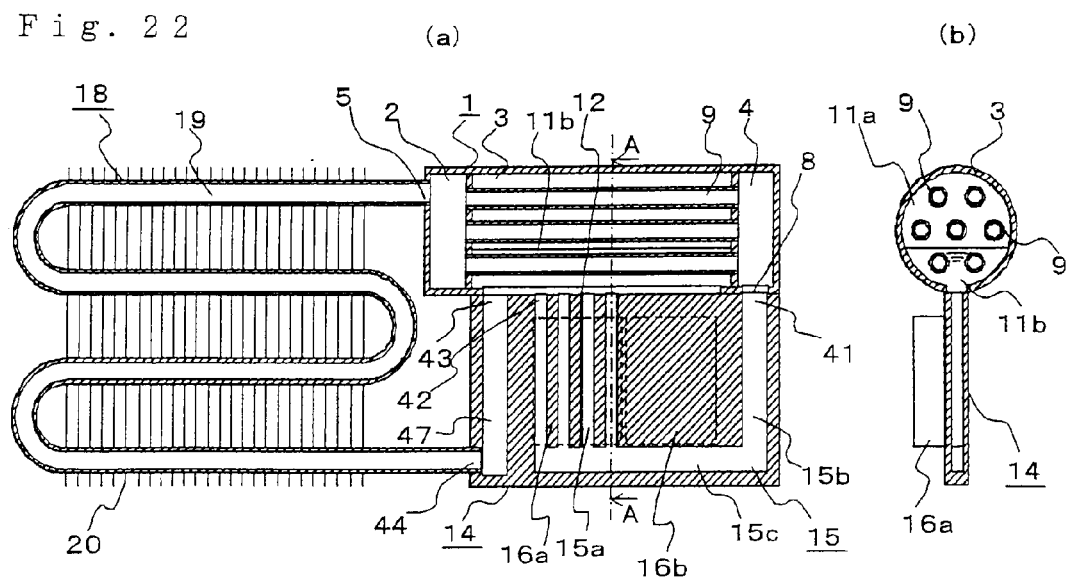
FIG. 22 is a cross-sectional view showing a configuration of other further cooling apparatus according to Embodiment 6 of the present invention.

Furthermore, FIG. 21 and FIG. 22 are cross-sectional views showing other configurations of the cooling apparatus according to Embodiment 6 of the present invention. FIG. 21(b) is a cross-sectional view in the cross section A-A shown in FIG. 21(a), and FIG. 22(b) is a cross-sectional view in the cross section A-A shown in FIG. 22(a).

In FIG. 21, a strong heating element 16a having a large heat release value and a weak heating element 16b having a small heat release value are mounted on an evaporator 14; and flow blocking bodies 38 are provided at outlets (two-phase fluid outlets 42) of heated flow paths 15a adjacent to the weak heating element 16b. Therefore, the same effects can be obtained as in the cooling apparatus shown in FIG. 20. The other configuration and function are the same as that of the cooling apparatus shown in FIG. 2. In FIG. 21, the flow blocking bodies 38 are provided at the outlets of the heated flow paths 15a adjacent to the weak heating element 16b; however, the flow blocking bodies 38 may be provided at inlets of the heated flow paths 15a adjacent to the weak heating element 16b.

In addition, the flow blocking body 38 is provided at each of the heated flow paths 15a in FIG. 20; however, there may be provided an integrated type flow blocking body 38 as shown in FIG. 21.

In FIG. 22, a strong heating element 16a having a large heat release value and a weak heating element 16b having a small heat release value are provided on an evaporator 14; and heated flow paths 15a are provided in the vicinity of the strong heating element 16a, but the heated flow paths 15a are not provided in the vicinity of the weak heating element 16b. That is, the heated flow paths 15a are provided adjacent to the strong heating element 16a. Therefore, the same effects can be obtained as in the cooling apparatus shown in FIG. 20. Further, since the flow blocking body 38 does not need to be provided and the number of the heated flow paths 15a to be formed can be decreased, manufacturability is improved. The other configuration and function are the same as that of the cooling apparatus shown in FIG. 2.

The cooling apparatus uses boiling phenomenon; and therefore, good heat transportation cannot be achieved if boiling is not possible. The boiling is not generated unless there is a certain level of temperature difference between an internal wall of the heated flow path 15a and a circulating liquid in the heated flow path 15a. The aforementioned temperature difference varies largely depending on physicality values of the circulating liquid and, at the same time, largely depends on heat flux (amount of heat-transfer per unit area) passing through surfaces (heat-transferring surface) where the internal wall of the heated flow path 15a is in contact with the circulating liquid in the heated flow path 15a. Therefore, a heat transfer area may be changed depending on the heat release value of the heating element 16; and in the case where the heat release value of the heating element 16 is small, the heat-transferring surface temperature can be higher than the temperature which starts boiling by reducing the heat transfer area. That is, the heat transfer area of the heated flow paths 15a adjacent to the weak heating element 16b is reduced (for example, the heated flow paths 15a are decreased in number or reduced in diameter); and accordingly, boiling is stably generated and the cooling apparatus can be stably operated. As an extreme example, FIG. 22 shows a configuration where the heated flow path 15a is not provided in the vicinity of the weak heating element 16b; however, the same effects can be obtained as in the above-mention even when the number of the heated flow paths 15a in the vicinity of the weak heating element 16b is decreased. Furthermore, even in the case where not only the number of the heated flow paths 15a is changed for each heating element 16, but also one heating element 16 is mounted on the evaporator 14, the same effects can be obtained when the heated flow paths 15a are provided in a dense arrangement at a portion where the heat release value is large in the heating element and the heated flow paths 15a are provided in a coarse arrangement at a portion where the heat release value is small.

Embodiment 7

A power converter according to the present Embodiment 7 is a power converter which has at least either an inverter or a converter as a heating element 16, and is provided with the cooling apparatus shown in any of Embodiments 1 to 6. The power converter is to convert DC to AC, or AC to DC; the power converter is for use in various types of apparatuses; and each inverter or each converter is cooled by air cooling or water cooling. The power converter according to the present Embodiment 7 is provided with the cooling apparatus having at least either the inverter or the converter as the heating element 16; and therefore, very high heat radiation characteristics are possessed, electric power does not need to be supplied to the cooling apparatus, and energy saving (high in the whole efficiency) can be achieved. Furthermore, it is possible to provide the power converter, which does not need to implement wiring, control, or the like and has good workability because a pump or the like is not required; and which is free from a fluid leak and has high reliability because there is not a removing connector or the like in mid-flow of flow paths.

The invention claimed is:

1. A cooling apparatus comprising:
    a block shaped evaporator in which an evaporator flow path through which a circulating liquid flows is formed in the inside of the evaporator, a heating element is arranged on the outside of the evaporator, and the circulating liquid is heated by heat emitted from said heating element;
    a heat radiator including a heat radiator flow path through which the circulating liquid flows, and that emits heat of the circulating liquid; and
    a heat exchanger which includes an inlet header including a heat exchanger low temperature liquid inlet to which the circulating liquid is fed from said heat radiator, an outlet header including an intermediate temperature liquid outlet from which the circulating liquid is delivered to said evaporator, and a containing unit including heat exchanger flow paths for linking said inlet header and said outlet header, the circulating liquid heated by said evaporator, and vapor of the circulating liquid,
    wherein said heat exchanger is joined to said evaporator disposed on the lower side of said heat exchanger in a face to face manner;
    said containing unit includes an opening portion in a joint portion with said evaporator;
    said outlet header includes said intermediate temperature liquid outlet at the joint portion with said evaporator; and
    said evaporator includes a circulating liquid holding unit, which holds the circulating liquid, depressed from a joint face of the evaporator with said heat exchanger in opposition to said opening portion of containing unit within the joint portion; includes a two-phase fluid outlet from which the circulating liquid and the vapor of the circulating liquid are delivered to said containing unit in an undersurface of said circulating liquid holding unit and an evaporator high temperature liquid inlet to which the circulating liquid is fed from said containing unit; includes an intermediate temperature liquid inlet to which the circulating liquid is fed from said outlet header at the joint portion with said heat exchanger in opposition to said intermediate temperature liquid outlet; includes an evaporator high temperature liquid outlet from which the circulating liquid is delivered to said heat radiator; and includes a high temperature liquid flow path which communicates said evaporator high temperature liquid inlet and said evaporator high temperature liquid outlet in the inside of the evaporator.

2. The cooling apparatus according to claim 1,
    wherein said heat exchanger includes a heat exchanger heat radiation unit which flows a cooling fluid to a cooling flow path, said cooling flow path being formed in the inside of said heat exchanger.

3. The cooling apparatus according to claim 1,
wherein said evaporator includes a thermal insulation portion which thermally insulates between said evaporator flow path and said high temperature liquid flow path.

4. The cooling apparatus according to claim 1, the heating element comprises a plurality of heating elements, a first heating element of the plurality of heating elements whose heat release value is smaller than that of a second heating element of the plurality of heating elements, wherein said evaporator is arranged with the plurality of heating elements, and includes a flow blocking body which blocks a flow of the circulating liquid in a heated flow path of said evaporator flow path adjacent to the first heating element.

5. The cooling apparatus according to claim 1, wherein said evaporator is arranged with an auxiliary heat radiator which emits heat on a first face on the opposite side to a second face in which said heating element is disposed.

6. The cooling apparatus according to claim 1,
wherein said heat exchanger flow path includes a recess on its outer wall.

7. A power converter comprising a cooling apparatus as set forth in claim 1,
wherein said heating element includes an inverter or a converter.

* * * * *